United States Patent
Ando et al.

(10) Patent No.: US 8,466,495 B2
(45) Date of Patent: Jun. 18, 2013

(54) FIELD EFFECT TRANSISTOR WITH REDUCED GATE LEAKAGE CURRENT

(75) Inventors: Yuji Ando, Tokyo (JP); Hironobu Miyamoto, Tokyo (JP); Tatsuo Nakayama, Tokyo (JP); Yasuhiro Okamoto, Tokyo (JP); Takashi Inoue, Tokyo (JP); Yasuhiro Murase, Tokyo (JP); Kazuki Ota, Tokyo (JP); Akio Wakejima, Tokyo (JP); Naotaka Kuroda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/468,373

(22) Filed: May 10, 2012

(65) Prior Publication Data

US 2012/0217547 A1 Aug. 30, 2012

Related U.S. Application Data

(62) Division of application No. 12/295,004, filed as application No. PCT/JP2007/000332 on Mar. 29, 2007, now Pat. No. 8,198,652.

(30) Foreign Application Priority Data

Mar. 29, 2006 (JP) .................................. 2006-091969

(51) Int. Cl.
*H01L 29/80* (2006.01)
(52) U.S. Cl.
USPC ...................... 257/192; 257/191; 257/E29.31
(58) Field of Classification Search
USPC ................................................ 257/192–195
See application file for complete search history.

(56) References Cited

U.S. PATENT DOCUMENTS

2005/0189559 A1* 9/2005 Saito et al. ..................... 257/189

FOREIGN PATENT DOCUMENTS

| JP | 11-261053 | 9/1999 |
|---|---|---|
| JP | 2001-185717 | 7/2001 |
| JP | 2002-050758 | 2/2002 |
| JP | 2004-273486 | 9/2004 |
| JP | 2005-243727 | 9/2005 |
| JP | 2005-244072 | 9/2005 |
| JP | 2005-260002 | 9/2005 |

OTHER PUBLICATIONS

European Patent Office issued an European Search Report dated Jul. 8, 2009, Application No. 07736989.0.
Ando Y et al., :"Novel ALGaN/GaN dual-field-plate FET with high gain, increased linearity and stability," International Electron Devices Meeting 5-7.12.2005, IEEE, Piscataway, NJ, USA, Dec. 5, 2005, pp. 576-579, XP010903543.

(Continued)

*Primary Examiner* — Ha Tran T Nguyen
*Assistant Examiner* — Raj R Gupta
(74) *Attorney, Agent, or Firm* — Young & Thompson

(57) ABSTRACT

Disclosed is an HJFET 110 which comprises: a channel layer 12 composed of $In_yGa_{1-y}N$ ($0 \leq y \leq 1$); a carrier supply layer 13 composed of $Al_xGa_{1-x}N$ ($0 \leq x \leq 1$), the carrier supply layer 13 being provided over the channel layer 12 and including at least one p-type layer; and a source electrode 15S, a drain electrode 15D and a gate electrode 17 which are disposed facing the channel layer 12 through the p-type layer, and provided over the carrier supply layer 13. The following relational expression is satisfied: $5.6 \times 10^{11} x < N_A \times \eta \times t \, [cm^{-2}] < 5.6 \times 10^{13} x$, where x denotes an Al compositional ratio of said carrier supply layer, t denotes a thickness of said p-type layer, $N_A$ denotes an impurity concentration, and $\eta$ denotes an activation ratio.

8 Claims, 15 Drawing Sheets

OTHER PUBLICATIONS

"A 110-W AlGaN/GaN Heterojunction FET on Thinned Sapphire Substrate", Y. Ando et al., Photonic and Wireless Devices REsearch laboratories, NEC Corporation, IEDM 01-381, 17.3.1-17.3.4.

Office Action issued Dec. 11, 2012 by the Japanese Patent Office in counterpart Japanese Patent Application Serial No. 2008-511958, with English translation of portions enclosed in wavy lines.

* cited by examiner

FIELD EFFECT TRANSISTOR WITH REDUCED GATE LEAKAGE CURRENT

CROSS REFERENCE TO RELATED APPLICATIONS

This application is a division of co-pending application Ser. No. 12/295,004 filed on Sep. 29, 2008, which is a National Stage of PCT/JP2007/000332 filed on Mar. 29, 2007, which claims foreign priority to Japanese Application No. 2006-091969 filed on Mar. 29, 2006. The entire content of each of these applications is hereby expressly incorporated by reference.

TECHNICAL FIELD

The present invention relates to a field effect transistor, and in particular to a hetero junction field effect transistor (HJFET) containing a Group III nitride semiconductor as a material.

BACKGROUND ART

There are known conventional hetero junction field effect transistors (HJFETs) found in Non-Patent Document 1 and Patent Document 1.

FIG. 15 is a sectional view showing a configuration of an HJFET described in Non-Patent Document 1.

The HJFET shown in FIG. 15 has a buffer layer 201, a channel layer 202 composed of gallium nitride (GaN), and a carrier supply layer 203 composed of aluminum gallium nitride (AlGaN) stacked in this order on a sapphire substrate 200.

In the HJFET, a two-dimensional electron gas 204 is formed in the channel layer 202 in the vicinity of the interface with the carrier supply layer 203, based on piezoelectric polarization effect ascribable to difference in the lattice constants between GaN and AlGaN, and based on an effect of spontaneous polarization.

On the carrier supply layer 203, there are formed a source electrode 205S and a drain electrode 205D while establishing ohmic contact therewith. A gate electrode 207 is formed on the AlGaN carrier supply layer 203 in a region fallen between the source electrode 205S and the drain electrode 205D, while establishing Schottky contact at the interface 203A with the carrier supply layer 203.

On the carrier supply layer 203 and the gate electrode 207, there is provided also a surface passivation film 208 composed of silicon nitride (SiN).

Alternatively, Patent Document 1 describes a normally-off HJFET having a channel layer composed of a non-doped GaN layer, and a barrier layer composed of AlGaN formed on, and brought into contact with, the channel layer. In order to realize the normally-off configuration of HJFET, which is intrinsically configured as normally-on, there is also described that a p-type semiconductor layer containing a p-type impurity is provided in the barrier layer under the gate electrode.

[Non-Patent Document 1] Y. Ando et al., Technical Digest of International Electron Device Meeting, p. 381, 2001
[Patent Document 1] Japanese Patent Application Publication No. 2004-273486

DISCLOSURE OF THE INVENTION

Problem to be Solved by the Invention

By the way, it has been known that the barrier height at the Schottky interface with a Group III nitride semiconductor such as GaN, AlGaN or the like is determined by difference between work function of a metal and electron affinity of the semiconductor, because pinning of the Fermi level exerts only a small influence. For this reason, the Schottky barrier height of AlGaN having an Al compositional ratio of 0.2, for example, will be relatively as low as 0.8 to 1.0 eV or around, although slightly depending on the electrode metal. Accordingly, as has been described with respect to the HJFET referring to FIG. 15, the Group III nitride HJFET using AlGaN as the carrier supply layer has been suffering from a problem of large density of gate leakage current, which limits the operation drain voltage.

In addition, the configuration of Patent Document 1 described above in the BACKGROUND ART has been suffering from that, because of its normally-off configuration, or because of having a positive threshold voltage, formation of a p-type semiconductor layer in the region other than the region right under the gate electrode may lower the channel concentration in that region, making current difficult to flow therethrough.

The configuration has been suffering from also that the process of manufacturing are complicated, because the p-type impurity should be introduced only in the vicinity of the region right under the gate electrode.

Means for Solving the Subjects

According to the present invention, there is provided a field effect transistor which comprises:
a channel layer composed of $In_yGa_{1-y}N$ ($0 \leq y \leq 1$);
a carrier supply layer composed of $Al_xGa_{1-x}N$ ($0 \leq x \leq 1$), the carrier supply layer being provided over the channel layer and including at least one p-type layer; and
a source electrode, a drain electrode and a gate electrode which are disposed facing the channel layer through the p-type layer, and provided over the carrier supply layer,
wherein the following relational expression is satisfied:

$$5.6 \times 10^{11} x < N_A \times \eta \times t \, [\text{cm}^{-2}] < 5.6 \times 10^{13} x, \quad \text{[Mathematical Formula 1]}$$

where x denotes an Al compositional ratio of the carrier supply layer, t denotes a thickness of the p-type layer, $N_A$ denotes an impurity concentration, and $\eta$ denotes an activation ratio.

According to the present invention, there is provided also a field effect transistor which comprises:
a channel layer composed of $In_yGa_{1-y}N$ ($0 \leq y \leq 1$) in which two-dimensional electron gas is to be formed;
a carrier supply layer composed of $Al_xGa_{1-x}N$ ($0 \leq x \leq 1$), the carrier supply layer being provided over the channel layer and including at least one p-type layer; and
a source electrode, a drain electrode and a gate electrode which are disposed facing the channel layer through the p-type layer, and provided over the carrier supply layer, wherein:
the following expression is satisfied:

$$x_a < x_1,$$

where $x_a$ denotes an Al compositional ratio of the carrier supply layer at an interface with the gate electrode, and $x_1$ denotes an Al compositional ratio at an interface with the channel layer; and
the following expression is satisfied:

$$5.6 \times 10^{11} x_1 < N_A \times \eta \times t \, [\text{cm}^{-2}] + 5.6 \times 10^{13}(x_1 - x_a) < 5.6 \times 10^{13} x_1, \quad \text{[Mathematical Formula 3]}$$

where $x_a$ denotes the Al compositional ratio, t denotes a thickness of the p-type layer, $N_A$ denotes an impurity concentration, and $\eta$ denotes an activation ratio.

In the present invention, the potential barrier against electrons under the gate electrode may be thickened, and thereby the gate leakage current may be reduced. In addition, lowering in the maximum drain current, as compared with the case without doping a p-type impurity, may be suppressed within a specified range.

In the present invention, the threshold voltage of the field effect transistor has a negative value. Unlike the HJFET described in Patent Document 1 explained above in BACKGROUND ART, having a positive threshold voltage, the present invention may efficiently produce two-dimensional electron gas over the entire range of the carrier supply layer, even if the source electrode and the drain electrode are provided on the p-type layer, and thereby current may stably be supplied.

Moreover, in the present invention, the p-type layer resides also in the regions between the source and the gate, and between the gate and the drain, which are susceptible to surface electric charge. As a consequence, influence of the surface electric charge may partially be shielded by the p-type layer, making the current-voltage characteristics more stable against surface conditions. For example, so-called current collapse, which is a phenomenon characterized by lowering in amplitude of drain current under input of large-amplitude voltage to the gate electrode, may be suppressed.

In the present invention, a part of the gate electrode may be buried in the carrier supply layer. Alternatively, in the present invention, a part of the p-type layer may be etched off to give a buried gate electrode structure. Also in this case, similar effects may be obtained, if the sheet impurity concentration of the p-type layer, which reside between the recessed portion with which the gate electrode is brought into contact and the channel layer, satisfies the relational expression described above.

According to the present invention, there is provided still also a field effect transistor which comprises:

a channel layer composed of $In_y Ga_{1-y} N$ ($0 \leq y \leq 1$);

a carrier supply layer composed of $Al_x Ga_{1-x} N$ ($0 \leq x \leq 1$), the carrier supply layer being provided over the channel layer and including at least one p-type layer; and a source electrode, a drain electrode and a gate electrode which are disposed facing the channel layer through the p-type layer, and provided over the carrier supply layer, the gate electrode being formed to be in contact with a recess portion formed by removing a part of the carrier supply layer, wherein the following relational expression is satisfied:

$$5.6 \times 10^{11} x < N_A \times \eta \times t \text{ [cm}^{-2}\text{]} < 5.6 \times 10^{13} x,$$

where t denotes a thickness of the p-type layer between the recessed portion and the channel layer, $N_A$ denotes an impurity concentration, and $\eta$ denotes an activation ratio.

According to the present invention, there is provided still also a field effect transistor which comprises:

a channel layer composed of $In_y Ga_{1-y} N$ ($0 \leq y \leq 1$);

a carrier supply layer composed of $Al_x Ga_{1-x} N$ ($0 \leq x = 1$), the carrier supply layer being provided over the channel layer and including at least one p-type layer; and a source electrode, a drain electrode and a gate electrode which are disposed facing the channel layer through the p-type layer, and provided over the carrier supply layer, the gate electrode being formed to be in contact with a recess portion formed by removing a part of the carrier supply layer, wherein the following relational expression is satisfied:

$$5.6 \times 10^{11} x_1 < N_A \times \eta \times t \text{ [cm}^{-2}\text{]} + 5.6 \times 10^{13} (x_1 - x_a) < 5.6 \times 10^{13} x_1,$$

where $x_a$ denotes an Al compositional ratio of the carrier supply layer at an interface with the gate electrode and is smaller than $x_1$, $x_1$ denotes an Al compositional ratio at an interface with the channel layer, t denotes a thickness of the p-type layer between the recessed portion and the channel layer, $N_A$ denotes an impurity concentration, and $\eta$ denotes an activation ratio.

It is to be understood that any arbitrary combinations of the individual configurations, any exchanges of expression in the present invention among method, apparatus and so forth, may be effective as embodiments of the present invention.

Effect of the Invention

As described above, the present invention successfully reduces the gate leakage current of the Group-III nitride HJFET.

BRIEF DESCRIPTION OF THE DRAWINGS

The above and other objects, advantages and features of the present invention will be more apparent from the following description of certain preferred embodiments taken in conjunction with the accompanying drawings.

BEST MODES FOR CARRYING OUT THE INVENTION

Figure 1:
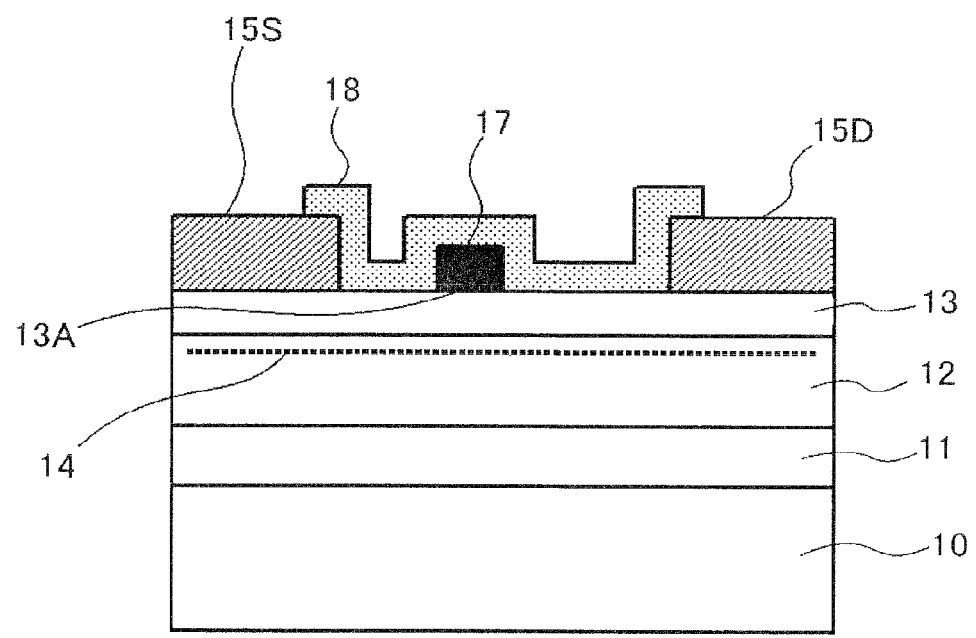
[FIG. 1] is a sectional view showing a sectional structure of an HJFET in an embodiment.

Embodiments according to the present invention will now be explained, referring to the attached drawings. In all drawings, any constituents commonly appear will be given with the same reference numerals, and explanation therefor will not be repeated.

First, an outline of the present invention will be explained, for the purpose of helping the understanding.

FIG. 1 is a sectional view showing a configuration of an HJFET of the present embodiment. An HJFET 110 shown in FIG. 1 has a buffer layer 11 composed of an aluminum nitride (AlN) layer, a channel layer 12 composed of $In_y Ga_{1-y} N$ ($0 \leq y \leq 1$) and a carrier supply layer 13 composed of $Al_xGa_{1-x}N$ ($0 \leq x \leq 1$) while being brought into contact in this order on a substrate 10 composed of silicon carbide (SiC).

In this embodiment, the channel layer 12 is composed of an undoped GaN layer.

The carrier supply layer 13 is provided on the channel layer 12, and includes at least one p-type layer. In this embodiment, the carrier supply layer 13 is composed of p-type $Al_xGa_{1-x}N$. The p-type $Al_xGa_{1-x}N$ layer is provided as being brought into contact with the channel layer 12, and over the entire region between the source and the drain.

In the HJFET 110, a two-dimensional electron gas 14 is formed in the channel layer 12 in the vicinity of the interface thereof with the carrier supply layer 13, based on piezoelectric polarization effect ascribable to difference in the lattice constants between GaN and AlGaN, and based on spontaneous polarization effect. The HJFET 110 is configured as generating the two-dimensional electron gas in the channel layer, in the region between the source electrode and the gate electrode, and in the region between the gate electrode and the drain electrode, when no voltage is applied to the gate electrode. In other words, the HJFET 110 has a negative threshold voltage.

A source electrode 15S, a drain electrode 15D and a gate electrode 17 are disposed facing the channel layer 12 through the p-type layer, and provided over the carrier supply layer 13.

More specifically, over the carrier supply layer 13 composed of p-type AlGaN, the source electrode 15S and the drain electrode 15D are formed, while individually establishing ohmic contact with the carrier supply layer 13. The gate electrode 17 is provided in the same plane with the source electrode 15S and the drain electrode 15D, wherein the bottom surface of the gate electrode 17 is positioned at the same level with the bottom surface of the source electrode 15S and the drain electrode 15D.

The gate electrode 17 is provided on the carrier supply layer 13 and in the region fallen between the source electrode 15S and the drain electrode 15D, while establishing Schottky contact at the interface 13A with the carrier supply layer 13. Transistor operation is obtained by adjusting potential of the gate electrode 17 to thereby modulate concentration of the two-dimensional electron gas 14.

In addition, a surface passivation film 18 composed of SiN is provided over the carrier supply layer 13 having the gate electrode 17 formed thereon, as being extended from the top surface of the source electrode 15S to the top surface of the drain electrode 15D, so as to cover the region fallen between the source electrode 15S and the drain electrode 15D.

In the HJFET 110, Al compositional ratio x of the carrier supply layer 13 composed of p-type AlGaN, thickness t of the carrier supply layer 13 composed of p-type AlGaN, impurity concentration $N_A$ in p-type AlGaN and activation ratio η satisfy the following relational expression:

[Mathematical Formula 3]

$$5.6 \times 10^{11} x < N_A \times \eta \times t \ [\text{cm}^{-2}] < 5.6 \times 10 x. \tag{}$$

This will be explained below.

First, fixed charge will generate at the AlGaN/GaN hetero interface, based on spontaneous polarization between Group III atom and N atom, and based on piezoelectric polarization ascribable to difference in the lattice constant between AlGaN and GaN. Sheet density $\sigma_P$ of the polarization charge is known to be approximated by the following equation (1), as a function of Al compositional ratio x of the AlGaN layer.

[Mathematical Formula 4]

$$\sigma_P = +qax. \tag{1}$$

In the above equation (1), q ($=1.6 \times 10^{-19}$ C) is elementary charge, and "a" ($=5.6 \times 10^{13}$ cm$^{-2}$) is a proportionality constant. For general growth on Ga face, sign of the polarization charge is given as positive at the AlGaN interface on GaN, and given as negative at the GaN interface on AlGaN. On the other hand, sheet density $\sigma_A$ of ionized impurity charge is given by the following equation (2), assuming thickness of the p-type AlGaN layer as t, p-type impurity concentration as $N_A$, and activation ratio as η:

[Mathematical Formula 5]

$$\sigma_A = qN_A\eta t. \tag{2}$$

The thickness t of the p-type AlGaN layer herein means the thickness of the carrier supply layer 13 in the region brought into contact with the gate electrode 17. In the HJFET 110 shown in FIG. 1, the gate electrode 17 is provided in the same plane with the source electrode 15S and the drain electrode 15D, and the carrier supply layer 13 having a uniform thickness is provided over the entire region ranging from the source electrode 15S and the drain electrode 15D, including the portion being in contact with the gate electrode 17. Alternatively, for the case where the gate electrode is configured as being formed by removing a part of the carrier supply layer, or as having a gate recess structure as described later, the thickness t of the p-type AlGaN layer herein means the thickness of the carrier supply layer 13 at the contact surface with the gate electrode formed as being brought into contact with the recessed portion.

The HJFET 110, characterized by a negative threshold voltage, has the two-dimensional electron gas 14 generated in the channel layer in the vicinity of the interface with the carrier supply layer 13, when no voltage is applied to the gate electrode 17.

In this case, the two-dimensional electron gas 14 generates in the channel layer 12 composed of GaN in the vicinity of the interface with the carrier supply layer 13 composed of AlGaN, if the absolute value of ionized impurity charge density $\sigma_A$ (minus signed) is smaller than the absolute value of polarization charge density $\sigma_P$ (positive signed), in other words, if the following relational expression (3) is satisfied.

[Mathematical Formula 6]

$$|\sigma_A| < |\sigma_P|. \tag{3}$$

This condition may be re-written using the above equations (1) and (2), and is given as the following relational expression (3'):

[Mathematical Formula 7]

$$N_A \times \eta \times t \ [\text{cm}^{-2}] < 5.6 \times 10^{13} x. \tag{3'}$$

By doping a p-type impurity into the carrier supply layer 13 composed of AlGaN, an upwardly convex conduction band profile is obtained. It may therefore be expected that the energy barrier against electrons may be thickened, and thereby gate tunneling current may be suppressed. However, too low p-type impurity concentration may fail in obtaining an effect of suppressing the gate leakage current, due to insufficient thickness of the energy barrier. On the other hand, too high p-type impurity concentration might fail in forming the two-dimensional electron gas 14, but the two-dimensional electron gas may be producible if the HJFET is configured as satisfying the above relational expression (3) or (3').

The present inventors then designed conditions of p-type impurity concentration under which the gate tunneling current can be suppressed, by clarifying relations between parameters relevant to element structure and characteristics of element through numerical calculation.

Figure 2:
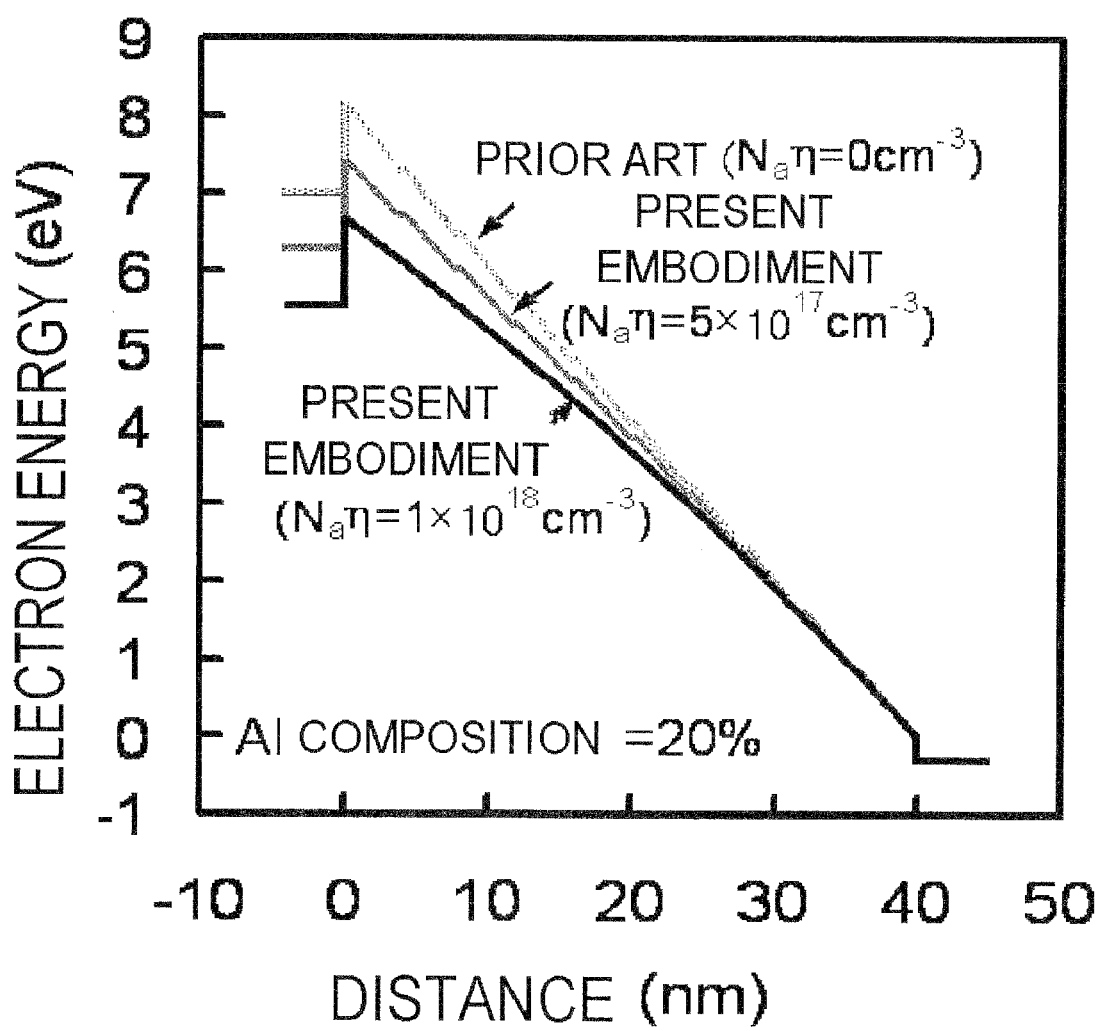
[FIG. 2] shows potential distributions of the HJFET in the embodiment.

First, energy distribution of the conduction band was calculated by solving Poisson's equation. FIG. 2 is a drawing showing an example of calculated energy distribution of the conduction band in the direction normal to the substrate. FIG. 2 shows distance of the carrier supply layer 13 away from the interface thereof with the gate electrode 17 interface (distance=0), wherein longer distance means that the position is more distant from the gate electrode 17.

FIG. 2 shows the calculated results obtained when effective impurity concentration in the carrier supply layer 13 composed of AlGaN, that is, a product $N_A \times n$ of p-type impurity concentration and activation ratio, was varied in three ways such as 0 cm$^{-3}$, $5 \times 10^{17}$ cm$^{-3}$ and $1 \times 10^{18}$ cm$^{-3}$. Al compositional ratio x of the AlGaN layer herein was assumed as 20%.

Figure 15:
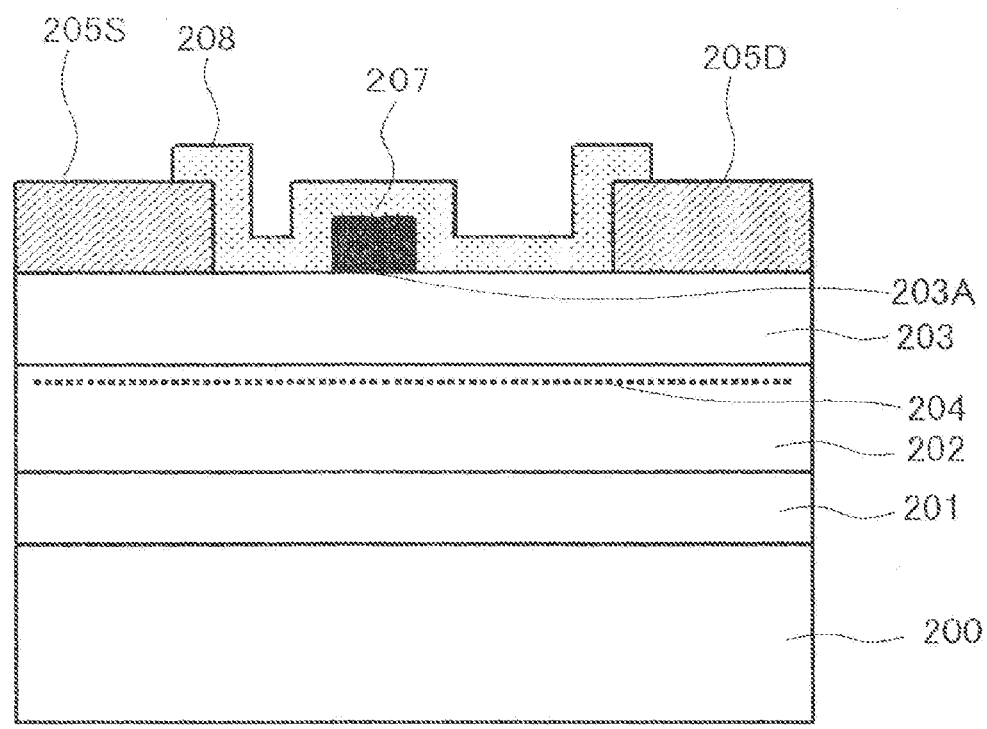
[FIG. 15] is a sectional view showing a sectional structure of a conventional HJFET.

In FIG. 2, results obtained $N_A \times \eta = 0$ cm$^{-3}$ corresponds to the conventional configuration shown in FIG. 15. As shown in FIG. 2, for the case of $N_A \times \eta = 0$ cm$^{-3}$, a linear energy distribution of the conduction band is obtained in the AlGaN layer. As a consequence, the tunnel barrier against electrons at the gate interface is thinned, and thereby tunneling current increases.

On the other hand, for the case of $N_A \times \eta = 5 \times 10^{17}$ cm$^{-3}$, an upwardly convex energy distribution may be obtained, due to negative charge of ionized impurity. As a consequence, the tunnel barrier against electrons at the gate interface may be thickened, and thereby tunneling current decreases. For the case of $N_A \times \eta = 1 \times 10^{18}$ cm$^{-3}$, the tunnel barrier against electrons at the gate interface may further be thickened, and thereby tunneling current is expected to further be reduced.

Next, the present inventors calculated density of the tunneling current flowing through the carrier supply layer 13 composed of AlGaN, based on the results of calculation of energy distribution in the conduction band.

Figure 3:
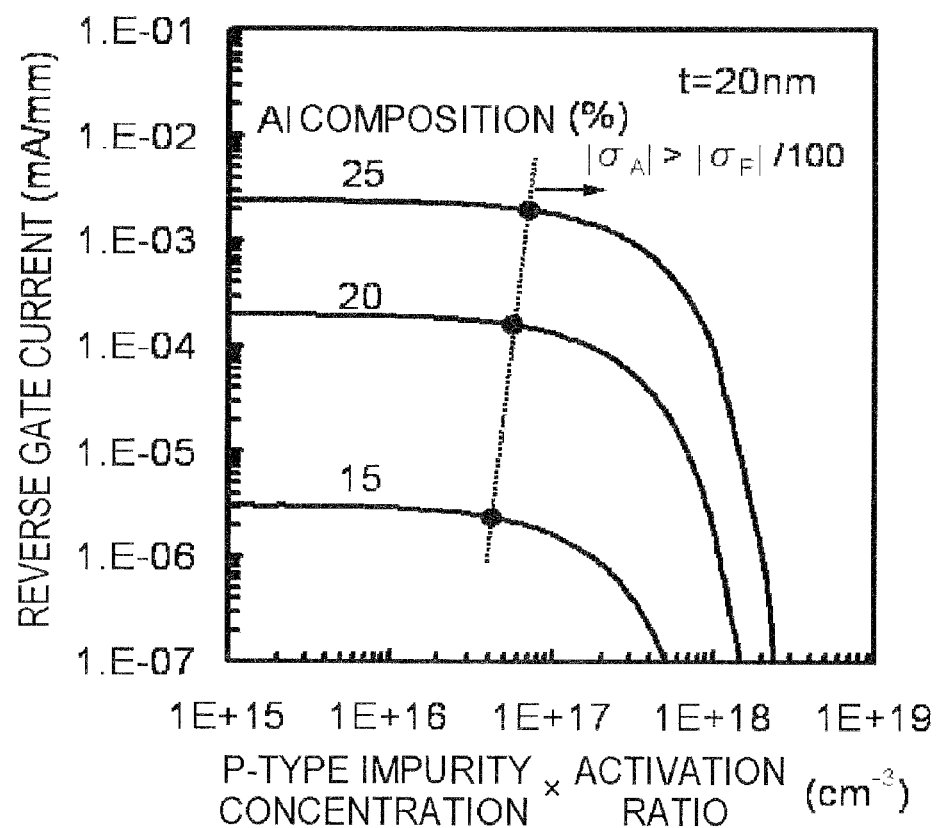
[FIG. 3] shows dependence of gate current of the HJFET in the embodiment on p-type impurity concentration.

FIG. 3 shows $N_A \times \eta$ dependence of gate leakage current estimated from the tunneling current density. Three results shown here were obtained under Al compositional ratios x of 15%, 20% and 25%. Thickness of the p-type AlGaN layer herein was assumed as t=20 nm.

FIG. 3 shows that the reverse gate leakage current sharply decreased on the higher concentration side as being bounded by filled dots (●) in the drawing. Therefore, these dots are now determined as the lower limits of $N_A \times \eta$. By using the above equations (1) and (2), these points stand for conditions given by:

$$|\sigma_A| = |\sigma_P|/100.$$

It is understood that the reverse gate current sharply decreases on higher concentration side of $N_A \times \eta$. Accordingly, conditions for effectively reducing the gate leakage current may be given by the following relational expression (4) or (4'). The following relational expressions (4) and (4') may be re-written vice versa using the equations (1) and (2) described above:

[Mathematical Formula 8]

$$|\sigma_A| > |\sigma_P|/100. \tag{4}$$

[Mathematical Formula 9]

$$N_A \eta t \,[\text{cm}^{-2}] > 5.6 \times 10^{11} x. \tag{4'}$$

By combining the above relational expressions (3') and (4'), the two-dimensional electron gas may be formed in the channel, wherein conditions under which an effect of suppressing gate current may be obtained will be given as below:

$$5.6 \times 10^{11} x < N_A \times \eta \times t \,[\text{cm}^{-2}] < 5.6 \times 10^{13} x.$$

In order to further decrease the gate leakage current, it may be good enough to satisfy the following relational expression (5), where the reverse gate current may be reduced approximately $1/10$ times as low as the undoped case. The following relational expression (5) may be re-written using the above equations (1) and (2), to give the following relational expression (5'):

[Mathematical Formula 10]

$$|\sigma_A| > |\sigma_P|/10. \tag{5}$$

[Mathematical Formula 11]

$$N_A \eta t \,[\text{cm}^{-2}] > 5.6 \times 10^{12} x. \tag{5'}$$

Next, $N_A \times \eta$ dependence of the maximum drain current $I_{max}$ was calculated.

Figure 4:
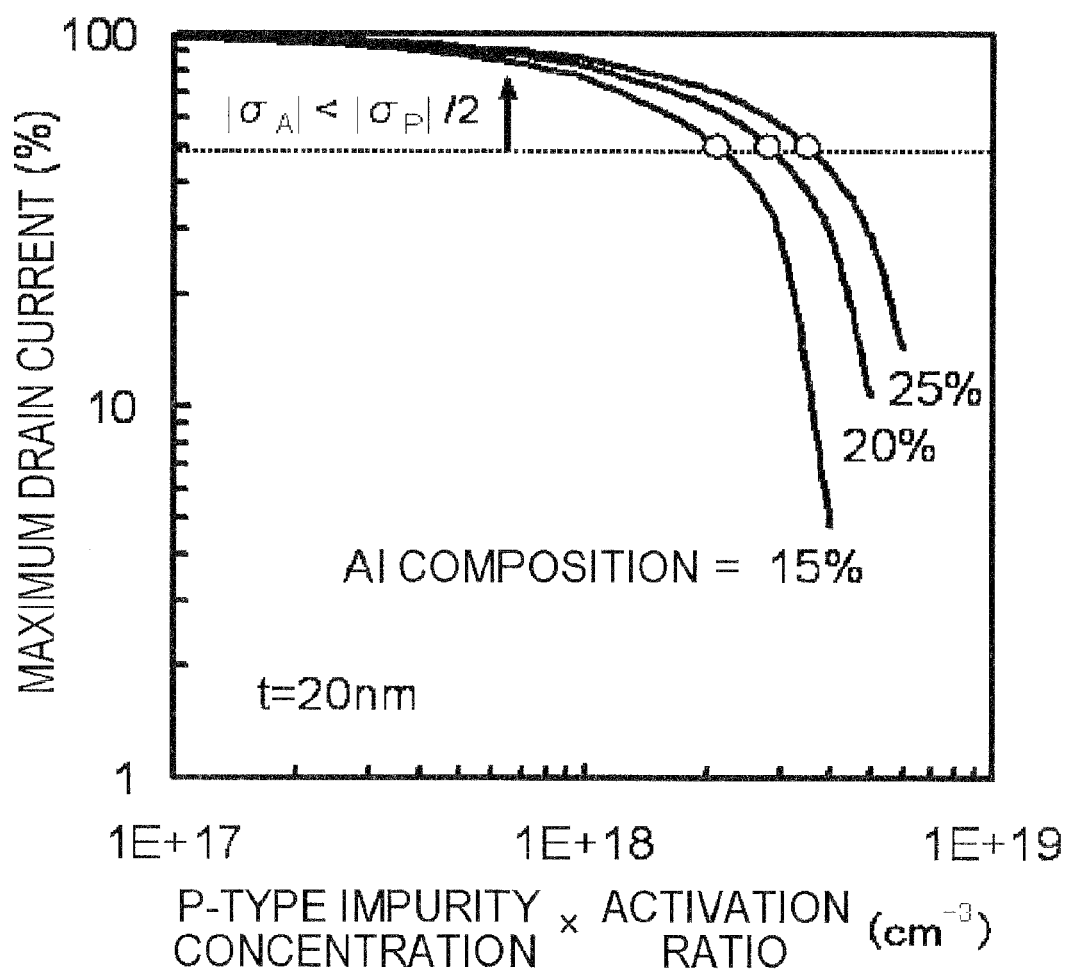
[FIG. 4] shows dependence of maximum drain current of the HJFET in the embodiment on p-type impurity concentration.

FIG. 4 shows calculated $N_A \times \eta$ dependence of $I_{max}$. FIG. 4 shows three results obtained under Al compositional ratios x of 15%, 20% and 25%. Thickness of the p-type AlGaN layer composing the carrier supply layer 13 was assumed as t=20 nm.

FIG. 4 shows that $I_{max}$ decreased as $N_A \times \eta$ increased. However, in FIG. 4, it was shown that ratio of decrease in $I_{max}$ was suppressed to as much as 50% or smaller on the lower concentration side as being bounded by conditions indicated by open dots (○), that is, the condition under which $|\sigma_A| = |\sigma_P|/2$ is given. Because the amount of decrease in $I_{max}$ may be suppressed to as much as 50% or smaller if this condition is set as the upper limit of $N_A \times \eta$, a distinct decrease in current drivability may be suppressed in a more reliable manner. This condition may be given by the following relational expression (6) or (6'). These relational expressions may be re-written vice versa, using the above equations (1) and (2).

[Mathematical Formula 12]

$$|\sigma_A| < |\sigma_P|/2. \tag{6}$$

[Mathematical Formula 13]

$$N_A \eta t \,[\text{cm}^{-2}] < 2.8 \times 10^{13} x. \tag{6'}$$

In view of further reducing the amount of decrease in $I_{max}$, a condition expressed by the following relational expression (7) or (7') may be more preferable. In this case, it was shown that the ratio of decrease in $I_{max}$ was suppressed to as much as 20% or smaller.

[Mathematical Formula 14]

$$|\sigma_A| < |\sigma_P|/5. \tag{7}$$

[Mathematical Formula 15]

$$N_A \eta t \,[\text{cm}^{-2}] < 1.12 \times 10^{13} x. \tag{7'}$$

Lastly, the present inventors calculated $N_A \times \eta$ dependence of the threshold voltage $V_{th}$.

Figure 5:
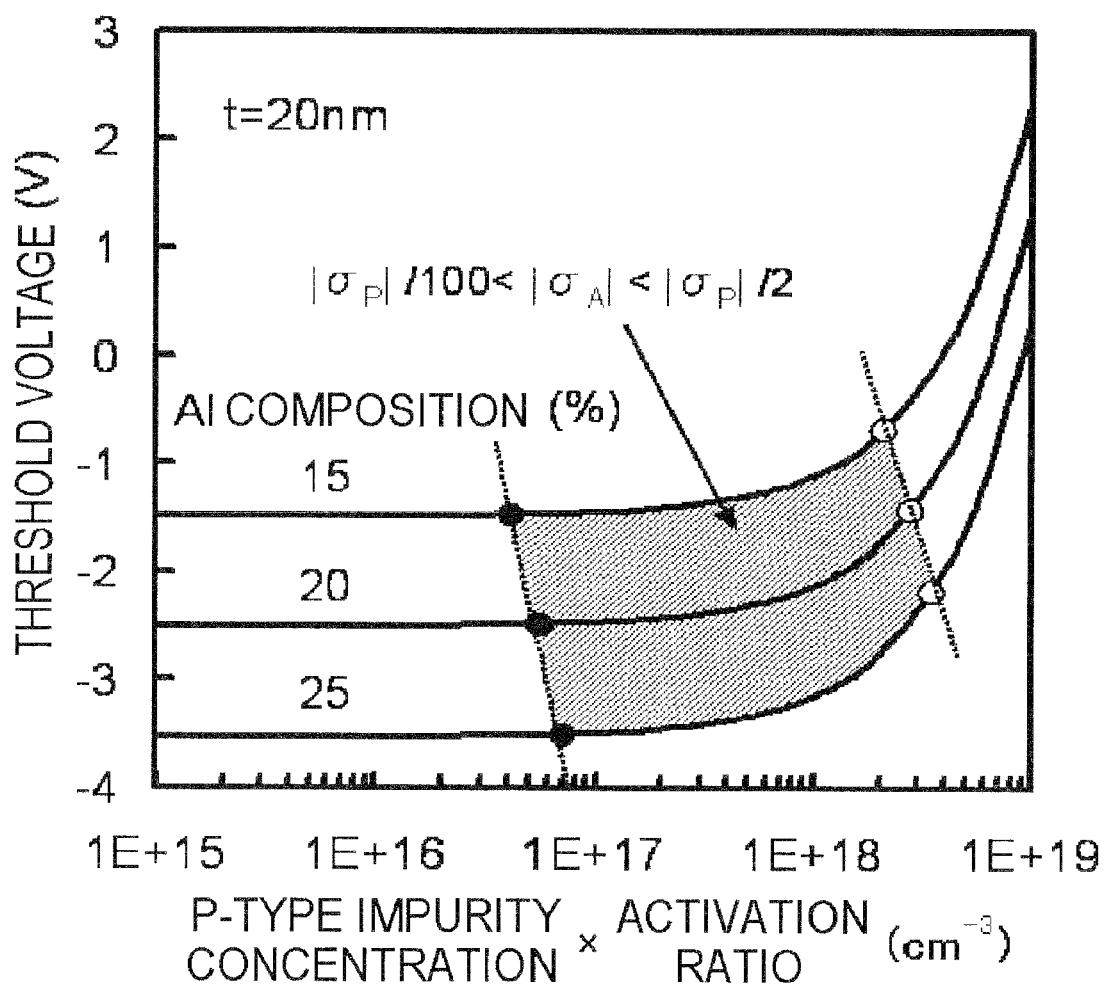
[FIG. 5] shows dependence of threshold voltage of the HJFET in the embodiment on p-type impurity concentration.

FIG. 5 shows calculated $N_A \times \eta$ dependence of $V_{th}$. Three results shown in FIG. 5 were obtained under Al compositional ratios x of 15%, 20% and 25%. Thickness of the p-type AlGaN layer herein was assumed as t=20 nm.

As shown in FIG. 5, $V_{th}$ shifts towards the positive side as $N_A \times \eta$ increases. The critical points of the relational expression (4), that is, the points where $$|\sigma_A| < |\sigma_P|/100$$

is satisfied were indicated by filled dots in FIG. 5. On the other hand, the critical points of the relational expression (6), that is, the conditions where $$|\sigma_A| < |\sigma_P|/2$$

is satisfied were indicated by open dots.

From FIG. 5, it is understood that, in the range over which the relational expressions (4) and (6) are satisfied, that is, the range over which the following relational expression is satisfied:

$$|\sigma_P|/100 < |\sigma_A| < |\sigma_P|/2,$$

where $V_{th}$ has a negative value.

Under conditions of making $V_{th}$ negative, the two-dimensional electron gas 14 may be produced even if the gate electrode 17 is not applied with positive charge, so that the two-dimensional electron gas 14 may be produced not only under the gate electrode 17, but also in the channel layer 5 between the source electrode 15S and the gate electrode 17. Similarly, the two-dimensional electron gas 14 is produced also in the channel layer 12 between the gate electrode 17 and the drain electrode 15D.

Because the threshold voltage in this embodiment is negative, unlike the case of Patent Document described above in BACKGROUND ART, transistor operation may be obtained without doping a p-type impurity only selectively under the gate electrode 17, so that the process may be simplified, and thereby cost and yield ratio in manufacturing of the element may be improved.

Moreover, in this embodiment, the p-type layer is provided also between the source and the gate, and between the gate and the drain, which are susceptible to surface charge. Accordingly, influences of the surface charge may partially be shielded by the p-type layer, and the current-voltage characteristics may be made more stable against the surface state. For example, current collapse phenomenon may be suppressed.

From the above discussion, it is understood that the gate leakage current may effectively be suppressed by adopting the configuration satisfying the above relational expression (4) or (4'). In addition, range of $N_A \times \eta$ not only for suppressing the gate leakage current, but also for further suppressing reduction in $I_{max}$ may be given by the following relational expression (8) or (8'):

[Mathematical Formula 16]

$$|\sigma_P|/100 < |\sigma_A| < |\sigma_P|/2. \quad (8)$$

[Mathematical Formula 17]

$$5.6 \times 10^{11} x < N_A \eta t \, [\text{cm}^{-2}] < 2.8 \times 10^{12} x. \quad (8')$$

By adopting the configuration satisfying the above relational expression (8) or (8'), the potential barrier against electrons under the gate electrode 17 may be thickened, the gate leakage current may be reduced, and thereby a Group III nitride HJFET having predetermined drain current and threshold voltage may be obtained. Accordingly, high frequency performance and power performance of the HJFET may further be improved. As described above referring to FIG. 5, the threshold voltage $V_{th}$ in the configuration satisfying the following relational expression (8) or (8') has a negative value.

A more preferable range of $N_A \times \eta$ may be expressed by the following relational expression (9) or (9'):

[Mathematical Formula 18]

$$|\sigma_P|/10 < |\sigma_A| < |\sigma_P|/5. \quad (9)$$

[Mathematical Formula 19]

$$5.6 \times 10^{12} x < N_A \eta t \, [\text{cm}^{-2}] < 1.12 \times 10^{12} x. \quad (9')$$

The above description explained the case where the p-type impurity concentration in the carrier supply layer 13 composed of an AlGaN layer is substantially uniform.

If $N_A$ and $\eta$ in the carrier supply layer composed of AlGaN layer is not uniform, similar calculation may be proceeded by using more generalized relational expressions (8") and (9") obtained by replacing the portion of $N_A \times \eta \times t$ in the above-described relational expressions (8') and (9') by the following formula:

[Mathematical Formula 20]

$$\int_0^t N_A(y)\eta(y)dy$$

[Mathematical Formula 21]

$$5.6 \times 10^{11} x < \int_0^t N_A(y)\eta(y)dy < 2.8 \times 10^{13} x \quad (8'')$$

[Mathematical Formula 22]

$$5.6 \times 10^{12} x < \int_0^t N_A(y)\eta(y)dy < 1.12 \times 10^{13} x. \quad (9'')$$

$N_A(y)$ herein represents distribution of impurity concentration, $\eta(y)$ represents distribution of activation ratio, wherein integral is calculated in the direction normal to the substrate. Range of integration is determined from the interface of the AlGaN carrier supply layer 13 with the channel layer 12, to the interface thereof with the gate electrode 17. In the HJFET 110 shown in FIG. 1, $N_A(y)$ and $\eta(y)$ have constant values of $N_A$ and $\eta$, respectively, so that the integrated value may be equal to $N_A \times \eta \times t$.

FIG. 1 shows a configuration in which the Al compositional ratio in the p-type layer was constant in the direction of stacking. Next, a case where the Al compositional ratio in the p-type layer is not uniform will be explained referring to FIG. 6.

Figure 6:
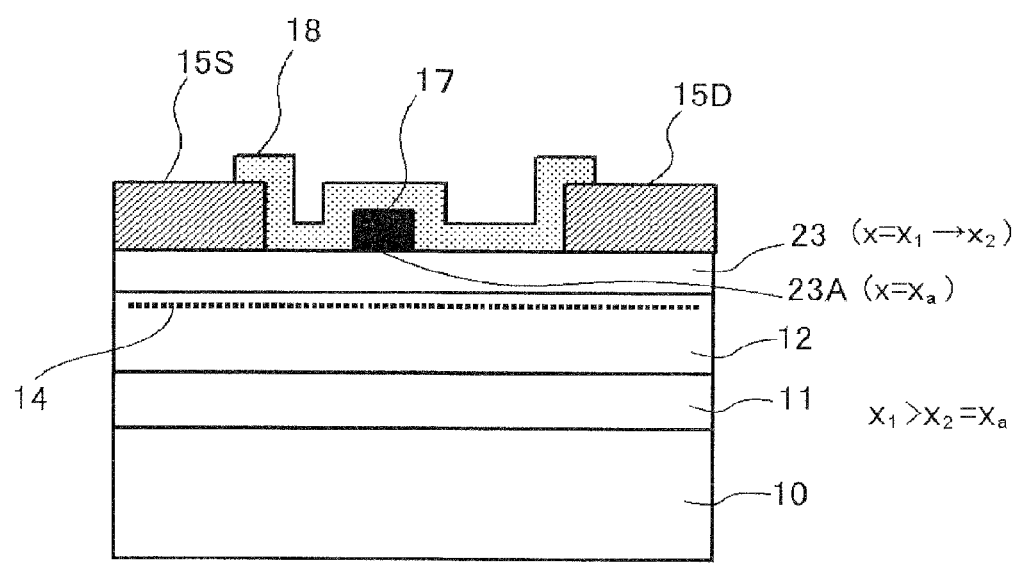
[FIG. 6] is a sectional view showing a sectional structure of the HJFET in an embodiment.

FIG. 6 is a sectional view showing another configuration of the HJFET of this embodiment. An HJFET 120 shown in FIG. 6 is obtained by replacing the carrier supply layer 13 composed of a p-type AlGaN layer in the HJFET 110 shown in FIG. 1, with the carrier supply layer 23 composed of a p-type composition graded AlGaN layer.

The Al compositional ratio x of the carrier supply layer 23 composed of an AlGaN layer continuously decreases from the channel interface ($x=x_1$) towards the surface ($x=x_2$) ($x_1 > x_2$). It is to be noted that, in FIG. 6 and so forth, the Al compositional ratio x of the AlGaN layer continuously decreasing from the channel interface ($x=x_1$) to the surface ($x=x_2$) may be expressed also as "$x=x1 \rightarrow x2$".

The HJFET 120 has a planar structure. In other words, the gate electrode 17 is provided in the same plane with the source electrode 15S and the drain electrode 15D, and the bottom surface of the gate electrode 17 is positioned on the same level with the bottom surface of the source electrode 15S and the drain electrode 15D. Accordingly, the Al compositional ratio $x_a$ of the carrier supply layer 23 composed of an AlGaN layer at the interface 23A thereof with the gate electrode 17 is equal to $x_2$.

Based on the equation (1), sheet density $\sigma_P$ of polarized charge generated at the interface between the carrier supply layer 23 composed of an AlGaN layer and the channel layer 12 composed of a GaN layer is expressed by the following equation (10):

[Mathematical Formula 23]

$$\sigma_P = +qax_1. \quad (10)$$

When a GaN layer is stacked on an AlGaN layer, negative polarized charge generates at the hetero interface in a discrete manner. Accordingly, if the Al compositional ratio is continuously decreased in the carrier supply layer 23 composed of AlGaN, continuous negative polarized charge generates in the AlGaN layer. Based on the above equation (1), sheet density ($\sigma_G$) of polarized charge generated in the AlGaN layer under the gate is expressed by the following equation (11):

[Mathematical Formula 24]

$$\sigma_G = -qa(x_1 - x_a). \quad (11)$$

The polarized charge acts as being electrically equivalent to charge ascribable to ionization of impurity, so that density of total fixed charge generated in the carrier supply layer 23 is given by a sum of ionization charge density $\sigma_A$ and polarization charge density $\sigma_G$.

Based on the above relational expression (3), a condition under which the two-dimensional electron gas 14 is formed in the GaN channel layer 12 in the vicinity of the interface thereof with the AlGaN carrier supply layer 23 may be expressed by the following relational expression (12):

[Mathematical Formula 25]

$$|\sigma_A| + |\sigma_G| < |\sigma_P|. \quad (12)$$

This condition can be re-written into the following condition, using the above equations (2), (10) and (11):

[Mathematical Formula 26]

$$N_A \eta t \, [\text{cm}^{-2}] < 5.6 \times 10^{13} x_A. \quad (12')$$

Conforming to the relational expression, the two-dimensional electron gas 14 generates in the channel.

Based on the above relational expression (4), a condition under which an effect of suppressing gate leakage current is obtained may be given as follows:

$$|\sigma_A| + |\sigma_G| > |\sigma_P|/100.$$

The condition may be re-written as follows, using the above equations (2), (10) and (11):

$$N_A \times \eta \times t \, [\text{cm}^{-2}] + 5.6 \times 10^{13}(x_1 - x_a) > 5.6 \times 10^{11} x_1.$$

As being combined with the above relational expression (12'), a relational expression under which the two-dimensional electron gas is formed in the channel, and the effect of suppressing gate current can be obtained, may be given as follows:

$$5.6 \times 10^{11} x_1 < N_A \times \eta \times t \, [\text{cm}^{-2}] + 5.6 \times 10^{13}(x_1 - x_a) < 5.6 \times 10^{13} x_1.$$

Based on the above relational expression (8), a range of $N_A \times \eta$ in which the effect of suppressing gate leakage current can be obtained, and $I_{max}$ and $V_{th}$ fall in more preferably ranges, may be expressed by the relational expression (13) or (13'). These relational expressions may be re-written using the above equations (2), (10) and (11).

[Mathematical Formula 27]

$$|\sigma_P|/100 < |\sigma_A| + |\sigma_G| < |\sigma_P|/2. \quad (13)$$

[Mathematical Formula 28]

$$5.6 \times 10^{11} x_1 < N_A \times \eta \times t \, [\text{cm}^{-2}] + 5.6 \times 10^{13}(x_1 - x_a) < 2.8 \times 10^{13} x_1. \quad (13')$$

Based on the above relational expression (9), a more preferable range of $N_A \times \eta$ may be expressed by the following relational expression (14) or (14') which can be re-written using the above equations (2), (10) and (11):

[Mathematical Formula 29]

$$|\sigma_P|/10 < |\sigma_A| + |\sigma_G| < |\sigma_P|/5. \quad (14)$$

[Mathematical Formula 30]

$$5.6 \times 10^{12} x_1 < N_A \times \eta \times t \, [\text{cm}^{-2}] + 5.6 \times 10^{13}(x_1 - x_A) < 1.12 \times 10^{13} x_1. \quad (14')$$

If $N_A$ and $\eta$ in the carrier supply layer 23 composed of the AlGaN layer are not uniform, the portion of $N_A \times \eta \times t$ in the above-described relational expressions (13') and (14') are replaced by the following formula:

[Mathemetical Formula 31]

$$\int_0^t N_A(y) \eta(y) dy.$$

$N_A(y)$ herein represents distribution of impurity concentration, $\eta(y)$ represents distribution of activation ratio, wherein integral is calculated in the direction normal to the substrate. Range of integration is determined from the interface of the carrier supply layer 13 composed of AlGaN with the channel layer 12, to the interface thereof with the gate electrode 17.

Next, embodiments according to the present invention will be explained referring to the attached drawings.

(First Embodiment)

FIG. 1 is a sectional view showing a configuration of an HJFET of this embodiment. This HJFET may be manufactured as follows.

First, the following layers are sequentially grown on a (0001) SiC substrate 10 typically by the metal-organic chemical vapor deposition (abbreviated as MOCVD):

the buffer layer 11 composed of undoped AlN: 20 nm;

the channel layer 12 composed of undoped GaN 12: 2 μm; and the carrier supply layer 13 composed of p-type $Al_xGa_{1-x}N$ (x=0.2): 20 nm.

AlGaN and GaN herein have different lattice constants, wherein a thickness of 20 nm of the carrier supply layer 13 composed of p-type AlGaN is not larger than the critical thickness where dislocation may occur. Magnesium (Mg), zinc (Zn) or the like may typically be used herein as the p-type impurity.

Metals such as titanium (Ti)/aluminum (Al)/niobium (Nb)/gold (Au) or the like are deposited by vacuum evaporation on the carrier supply layer 13, and alloyed to thereby form the source electrode 15S and the drain electrode 15D respectively, while establishing ohmic contact. Next, the gate electrode 17 is formed on the carrier supply layer 13, or on the surface of the AlGaN layer, in the portion fallen between the source electrode 15S and the drain electrode 15D, by depositing metals such as nickel (Ni)/Au typically by vacuum evaporation, followed by lift-off. In this way, Schottky contact may be established at the interface 13A with the carrier supply layer 13. Lastly, the surface passivation film 18 composed of SiN is grown typically to as thick as 100 nm by plasma-enhanced chemical vapor deposition (abbreviated as PECVD). In this way, the semiconductor device as shown in FIG. 1 may be manufactured.

Concentration $N_A$ and activation ratio η of a p-type impurity in the AlGaN layer 13 which functions as the carrier supply layer 13 are combined so as to satisfy the above relational expression (8').

In thus-configured HJFET, an effect of suppressing gate leakage current based on the principle described above may be obtained, and $I_{max}$ and $V_{th}$ may fall in still more desirable ranges. For example, given $N_A = 1 \times 10^{18}$ cm$^{-3}$ and η=0.5, the effective impurity concentration may be $5 \times 10^{17}$ cm$^{-3}$. The gate leakage current herein is suppressed to as low as approximately 12% of that in the prior art, that is, the case where the carrier supply layer is composed of undoped $Al_{0.2}Ga_{0.8}N$. A range of reduction in $I_{max}$ is approximately 9% as compared with the prior art, and $V_{th}$ is given as approximately −2.3 V.

(Second Embodiment)

FIG. 6 is a drawing showing a sectional structure of a second embodiment of HJFET of the present invention. This embodiment is obtained by replacing the carrier supply layer 13 composed of a p-type AlGaN layer in the first embodiment shown in FIG. 1, with the carrier supply layer 23 composed of a p-type composition graded AlGaN layer:

the carrier supply layer 23 composed of p-type composition graded $Al_xGa_{1-x}N$ ($0.175 \leq x \leq 0.2$): 20 nm.

AlGaN and GaN herein have different lattice constants, wherein a thickness of 20 nm of p-type composition graded AlGaN is not larger than the critical thickness where dislocation may occur.

Magnesium (Mg), zinc (Zn) or the like may typically be used herein as the p-type impurity. The Al compositional ratio of the p-type composition graded $Al_xGa_{1-x}N$ layer, or the carrier supply layer 23, continuously decreases ($x=0.2 \rightarrow 0.175$) from the interface ($x_1=0.2$) with the channel layer 12 to the surface ($x_2=0.175$).

This embodiment relates to the planar structure, wherein the Al compositional ratio $x_a$ of the carrier supply layer 23 at the interface 23A thereof with the gate electrode 17 is equivalent to $x_2=0.175$.

When the carrier supply layer 23 is formed, amounts of supply of trimethyl gallium (TMG), trimethyl aluminum (TMA) and ammonia ($NH_3$) gas through a gas introducing pipe of an MOCVD apparatus are adjusted, wherein the amounts supply of trimethyl aluminum (TMA) and ammonia ($NH_3$) are kept at constant levels, whereas the amount of supply of trimethyl gallium (TMG) is gradually increased.

Concentration $N_A$ and activation ratio $\eta$ of p-type impurity in the carrier supply layer 23 are combined so as to satisfy the above relational expression (13'). In thus-configured HJFET, an effect of suppressing gate current based on the principle described above may be obtained, and $I_{max}$ and $V_{th}$ may fall in still more desirable ranges.

For example, given $N_A = 5 \times 10^{17}$ cm$^{-3}$ and $\eta = 0.6$, the effective impurity concentration is given as $3 \times 10^{17}$ cm$^{-3}$. In this case, the gate leakage current is suppressed approximately to as low as 4% of that of a configuration in which the carrier supply layer has a uniform composition of undoped $Al_{0.2}Ga_{0.8}N$. The range of decrease in $I_{max}$ in comparison with this configuration is given as approximately 18%, and $V_{th}$ as approximately −2.2 V.

The composition graded AlGaN is used for the p-type carrier supply layer 23 in this embodiment, so that an effect of suppressing gate current may be obtained at an impurity concentration lower than that in the first embodiment using the compositionally uniform AlGaN. Because lower impurity concentration tends to improve the activation ratio, controllability of the epitaxial growth may be improved, and thereby yield ratio and reproducibility of the element characteristics may further be improved.

The carrier supply layer 23 composed of a p-type AlGaN, configured in this embodiment using the composition graded AlGaN layer in which the Al compositional ratio continuously decreases, is not limited thereto, instead allowing adoption of a configuration in which the Al composition decreases in a step-wise manner, and allowing adoption of two or three or more AlGaN layers varied in the composition in a step-wise manner.

(Third Embodiment)

Figure 7:
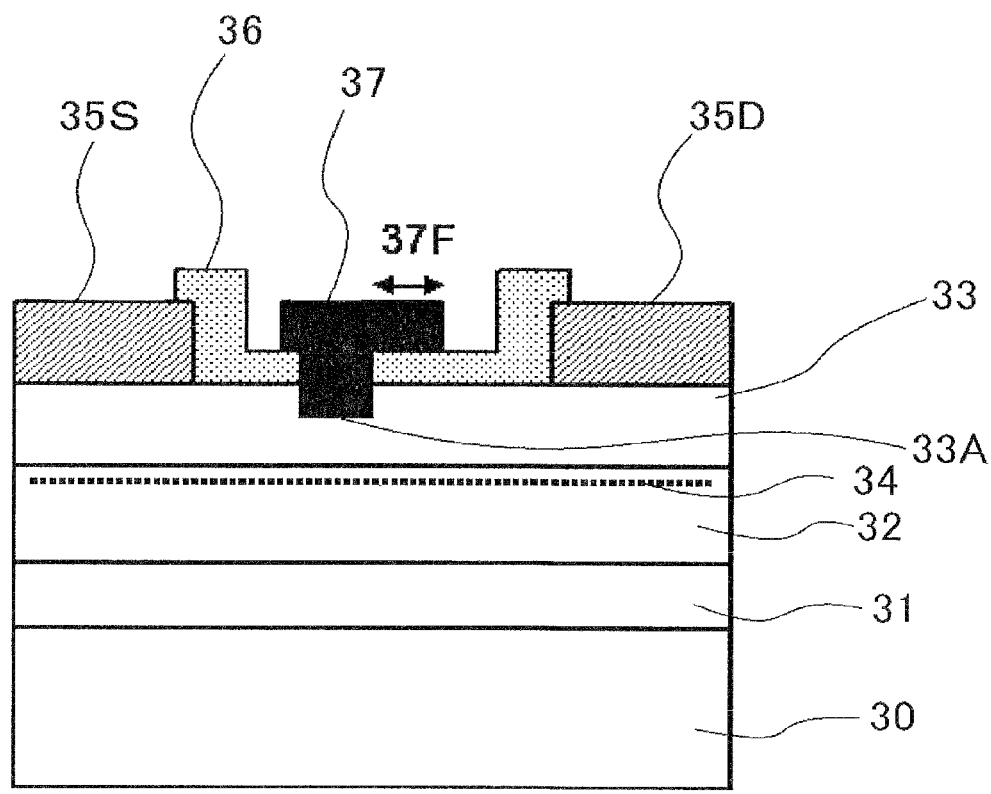
[FIG. 7] is a sectional view showing a sectional structure of the HJFET in an embodiment.

FIG. 7 is a sectional view showing a configuration of an HJFET of this embodiment.

In FIG. 7, a buffer layer 31 composed of undoped AlN, a channel layer 32 composed of undoped GaN, and a carrier supply layer 33 composed of p-type AlGaN are stacked in this order on a substrate 30 composed of SiC. A two-dimensional electron gas 34 is formed in the channel layer 32 in the vicinity of the interface thereof with the carrier supply layer 33, based on piezoelectric polarization ascribable to difference in the lattice constant between AlGaN and GaN, and based on spontaneous polarization.

Over the carrier supply layer 33 composed of AlGaN, a source electrode 35S and a drain electrode 35D are formed, while individually establishing ohmic contact therewith. A surface passivation film 36 composed of SiN is formed over the AlGaN carrier supply layer 33. A gate electrode 37 is formed in a recessed portion formed by etching off the surface passivation film 36 and a part of the carrier supply layer 33, while establishing Schottky contact at the interface 33A with the carrier supply layer 33. A part of the gate electrode 37 is buried in the carrier supply layer 33.

The gate electrode 37 herein has an overhang portion 37F projected out towards the drain electrode 35D side, thereby the gate electrode 37 is brought into contact with the surface passivation film 36 in the overhang portion thereof.

This sort of semiconductor device may be manufactured as follows. On the (0001) SiC substrate 30, the layer shown below are sequentially grown typically by the MOCVD:

the buffer layer 31 composed of undoped AlN: 20 nm;
the channel layer 32 composed of undoped GaN: 2 μm; and
the carrier supply layer 33 ($x=0.2$) composed of p-type $Al_xGa_{1-x}N$: 40 nm.

AlGaN and GaN herein have different lattice constants, wherein a thickness of 40 nm of p-type $Al_xGa_{1-x}N$ layer which functions as the carrier supply layer 33 is not larger than the critical thickness where dislocation may occur. Mg, Zn or the like may typically be used herein as the p-type impurity. Metals such as Ti/Al/Nb/Au or the like are deposited by vacuum evaporation on the AlGaN layer, and alloyed to thereby form the source electrode 35S and the drain electrode 35D respectively, while establishing ohmic contact.

Next, for example, the surface passivation film 36 composed of SiN is grown approximately to as thick as 100 nm by PECVD. An opening is formed by etching the surface passivation film 36 in the portion thereof fallen between the source electrode 35S and the drain electrode 35D.

Next, a recessed portion is formed by etching off a part of the carrier supply layer 33, using the surface passivation film 36 as a mask, typically using a dry etching apparatus using a chlorine ($Cl_2$)-base gas. Over the recessed portion, metals such as Ni/Au are deposited by vapor evaporation, followed by lift-off process, to thereby form the gate electrode 37 having the overhang portion 37F. In this way, Schottky contact is established at the interface 33A with the AlGaN layer. By these procedures, the HJFET shown in FIG. 7 may be manufactured.

Also in this embodiment, concentration $N_A$ and activation ratio $\eta$ of a p-type impurity in the carrier supply layer 33 are combined so as to satisfy the above relational expression (8'). In this embodiment, the gate electrode 37 is formed in contact with the recessed portion formed by removing a part of the carrier supply layer 33, so that the thickness t of the p-type AlGaN layer in the above relational expression (8') means the thickness of the p-type layer which resides in the portion fallen between the gate interface 33A and the channel layer 32, that is, the thickness of the p-type layer between the recessed portion and the channel layer 32. The thickness in this embodiment is typically adjusted to $t = 20$ nm.

In thus-configured HJFET, an effect of suppressing gate leakage current based on the principle described above may be obtained, and $I_{max}$ and $V_{th}$ may fall in still more desirable ranges. Assuming, for example, the Al compositional ratio x as 0.2, the p-type impurity concentration $N_A$ as $1 \times 10^{18}$ cm$^{-3}$ and the activation ratio $\eta$ as 0.5 (the effective impurity concentration is $5 \times 10^{17}$ cm$^{-3}$), the gate leakage current may be suppressed to as low as approximately 12% of that in the prior art (undoped AlGaN). A range of reduction in $I_{max}$ is approximately 9% as compared with the prior art, and $V_{th}$ is given as approximately −2.3 V.

In this embodiment, the gate electrode 37 is formed in the recessed portion formed by etching off a part of the carrier supply layer 33. As a consequence, distance between the two-dimensional electron gas layer 34 and the surface of AlGaN may be increased, while keeping the transconductance at a high level by reducing the distance between the two-dimensional electron gas layer 34 and the gate electrode 37, and thereby instability ascribable to surface trap, such as current collapse, may be suppressed as compared with the first embodiment characterized by the planar structure.

In addition, the gate electrode 37 has the overhang portion 37F in contact with the surface passivation film 36 composed of SiN. The overhang portion 37F functions as a so-called field plate electrode. More specifically, a depletion layer is formed under the overhang portion 37F, electric field intensity between the gate and the drain is reduced, and thereby the gate breakdown voltage may be improved as compared with the first embodiment having no overhang portion.

(Fourth Embodiment)

Figure 8:
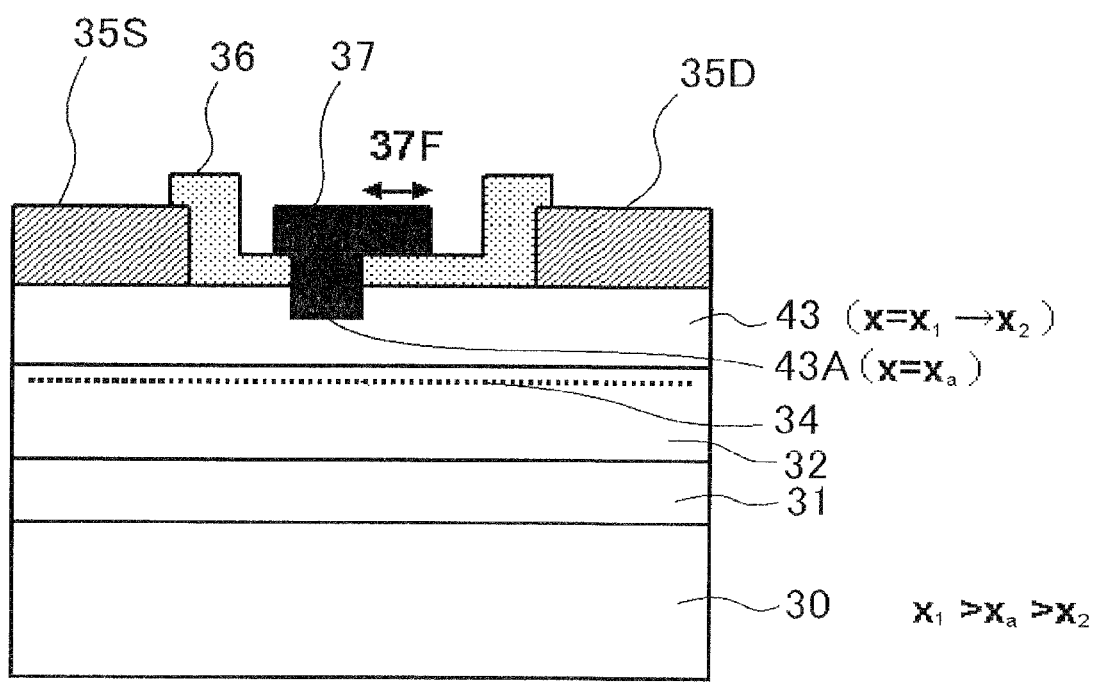
[FIG. 8] is a sectional view showing a sectional structure of the HJFET in an embodiment.

FIG. 8 is a sectional view showing a configuration of an HJFET of this embodiment. This embodiment is obtained by replacing the carrier supply layer 33 composed of p-type AlGaN in the third embodiment shown in FIG. 7, with the carrier supply layer 43 composed of a p-type composition graded AlGaN layer shown below:

the carrier supply layer 43 composed of p-type composition graded $Al_xGa_{1-x}N$ ($0.15 \leq x \leq 0.2$): 40 nm.

AlGaN and GaN herein have different lattice constants, wherein a thickness of 40 nm of p-type composition graded AlGaN layer composing the carrier supply layer 43 is not larger than the critical thickness where dislocation may occur. Mg, Zn or the like may typically be used herein as the p-type impurity.

The Al compositional ratio of the p-type composition graded $Al_xGa_{1-x}N$ layer, which functions as the carrier supply layer 43, continuously decreases (x=0.2→0.15) from the interface ($x_1$=0.2) with the channel layer 32 composed of GaN to the surface ($x_2$=0.15).

Because the recessed structure is adopted in this embodiment, the Al compositional ratio $x_a$ at the gate interface 43A will have a value fallen between $x_1$ and $x_2$, which is $x_a$=0.175 for example. Concentration $N_A$ and activation ratio η of p-type impurity of the AlGaN layer are combined so as to satisfy the above relational expression (13'). In this embodiment, the gate electrode 37 is formed in contact with the recessed portion formed by removing a part of the carrier supply layer 43, so that the thickness t of the p-type AlGaN layer in the above relational expression (13') means the thickness of the p-type layer which resides in the portion fallen between the gate interface 43A and the channel layer 32, that is, the thickness of the p-type layer between the recessed portion and the channel layer 32. The thickness in this embodiment is typically adjusted to t=20 nm.

In thus-configured HJFET, an effect of suppressing gate leakage current based on the principle described above may be obtained, and $I_{max}$ and $V_{th}$ may fall in still more desirable ranges. Given, for example, $N_A$=5×10$^{17}$ cm$^{-3}$ and η=0.6 (effective impurity concentration is 3×10$^{17}$ cm$^{-3}$), the gate leakage current may be suppressed to as low as approximately 4% of that in the prior art (undoped uniform composition of $Al_{0.2}Ga_{0.8}N$). A range of reduction in $I_{max}$ is approximately 18% as compared with the prior art, and $V_{th}$ is given as approximately −2.2 V.

The composition graded AlGaN is used for the p-type carrier supply layer in this embodiment, so that an effect of suppressing gate current may be obtained at an impurity concentration lower than that in the third embodiment using the compositionally uniform AlGaN. Because lower impurity concentration tends to improve the activation ratio, controllability of the epitaxial growth may be improved, and thereby yield ratio and reproducibility of the element characteristics may further be improved.

The p-type carrier supply layer 43, configured in this embodiment using the composition graded AlGaN layer, may of course be configured using two or three or more AlGaN layers varied in the composition in a step-wise manner.

(Fifth Embodiment)

Figure 9:
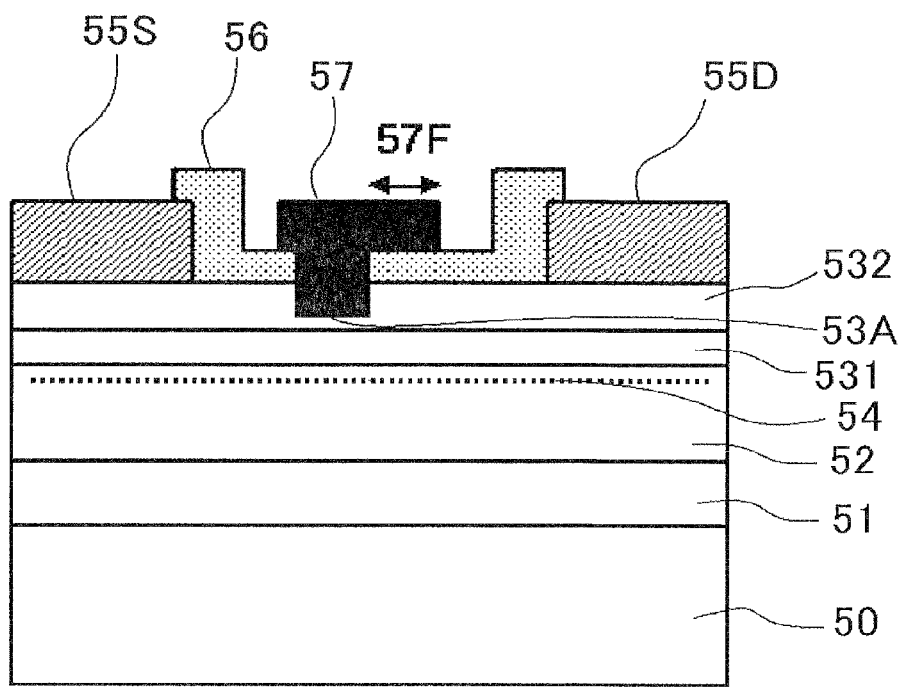
[FIG. 9] is a sectional view showing a sectional structure of the HJFET in an embodiment.

FIG. 9 is a sectional view showing a configuration of an HJFET of this embodiment.

In FIG. 9, a buffer layer 51 composed of undoped AlN, a channel layer 52 composed of undoped GaN, a p-type $Al_xGa_{1-x}N$ layer 531, and an undoped $Al_xGa_{1-x}N$ layer 532 are sequentially stacked on the SiC substrate 50.

A two-dimensional electron gas 54 is formed in the channel layer 52 in the vicinity of the interface thereof with the p-type $Al_xGa_{1-x}N$ layer 531, based on piezoelectric polarization ascribable to difference in the lattice constant between GaN and AlGaN, and based on spontaneous polarization.

Over the undoped AlGaN layer 532, a source electrode 55S and a drain electrode 55D are formed, while individually establishing ohmic contact therewith. A surface passivation film 56 composed of SiN is formed over the undoped AlGaN layer 532.

A gate electrode 57 is formed in a recessed portion formed by etching off the surface passivation film 56 and a part of the undoped AlGaN layer 532, while establishing Schottky contact at the interface 53A with the AlGaN layer 532. The gate electrode 57 herein has an overhang portion 57F projected out towards the drain electrode 55D side, thereby the gate electrode 57 is brought into contact with the surface passivation film 56 in the overhang portion thereof.

Thus-configured HJFET may be manufactured as follows.

First, over the (0001) SiC substrate 50, the layers below are grown typically by MOCVD, in the order and to thickness described below:

the buffer layer 51 composed of undoped AlN: 20 nm;
the channel layer 52 composed of undoped GaN: 2 μm;
the p-type $Al_xGa_{1-x}N$ layer 531 (x=0.2): 20 nm; and
the undoped $Al_xGa_{1-x}N$ layer 532 (x=0.2): 20 nm.

AlGaN and GaN herein have different lattice constants, wherein a total thickness of 40 nm of the p-type $Al_xGa_{1-x}N$ layer 531 and the undoped $Al_xGa_{1-x}N$ layer is not larger than the critical thickness where dislocation may occur. Mg, Zn or the like may typically be used herein as the p-type impurity.

Metals such as Ti/Al/Nb/Au or the like are deposited by vacuum evaporation on the undoped $Al_xGa_{1-x}N$ layer 532, and alloyed to thereby form the source electrode 55S and the drain electrode 55D respectively, while establishing ohmic contact.

Next, for example, a SiN film which functions as the insulating passivation film 56 is grown approximately to as thick as 100 nm by PECVD. An opening is formed by etching the SiN film in the portion thereof fallen between the source electrode 55S and the drain electrode 55D.

Next, a recessed portion is formed in the undoped AlGaN layer 532, typically by dry etching using a $Cl_2$-base gas, so as to remove a part of undoped AlGaN layer 532 in a predetermined region thereof fallen between the source electrode 55S and the drain electrode 55D, using the SiN film as a mask.

Over the recessed portion, metals such as Ni/Au are deposited by vapor evaporation, followed by lift-off process, to thereby form the gate electrode 57 having the overhang portion 57F. In this way, Schottky contact is established at the interface 53A with the AlGaN layer. By these procedures, the HJFET shown in FIG. 9 may be manufactured.

In this embodiment, concentration $N_A$ and activation ratio η of a p-type impurity in the p-type $Al_xGa_{1-x}N$ layer 531 are combined so as to satisfy the above relational expression (8'). The thickness t of the p-type AlGaN layer in the above relational expression (8') means the thickness of the p-type layer which resides in the portion fallen between the gate interface 53A and the channel layer 52, and is typically adjusted to t=20 nm in this embodiment.

In thus-configured HJFET, an effect of suppressing gate leakage current based on the principle described above may be obtained, and $I_{max}$ and $V_{th}$ may fall in still more desirable ranges. Assuming, for example, the p-type impurity concentration $N_A$ as $1 \times 10^{18}$ cm$^{-3}$ and the activation ratio η as 0.5 (the effective impurity concentration is $5 \times 10^{17}$ cm$^{-3}$), the gate leakage current may be suppressed to as low as approximately 12% of that in the prior art (undoped $Al_{0.2}Ga_{0.8}N$). A range of reduction in $I_{max}$ is approximately 9% as compared with the prior art.

In this embodiment, the gate electrode 57 is formed in the recessed portion formed by etching off a part of the undoped $Al_xGa_{1-x}N$ layer 532. For this reason, ionization charge density $\sigma_A$ of the p-type impurity under the gate does not vary even if the depth of recess may slightly vary. As a consequence, the process margin may be improved as compared with the third embodiment forming the recessed portion in the p-type $Al_xGa_{1-x}N$ layer 531, and thereby in-plane uniformity of the element characteristics may be improved.

(Sixth Embodiment)

Figure 10:
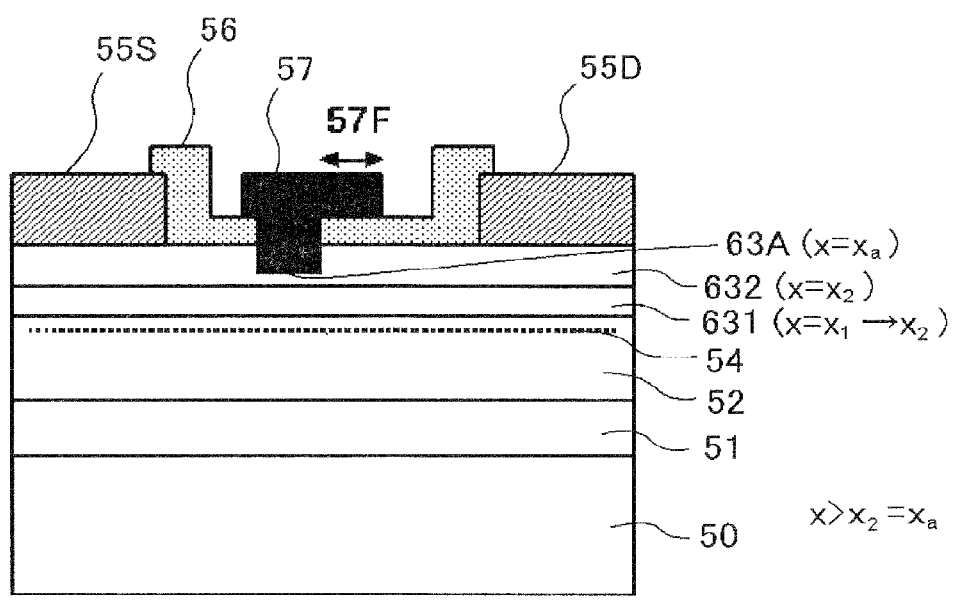
[FIG. 10] is a sectional view showing a sectional structure of the HJFET in an embodiment.

FIG. 10 is a sectional view showing a configuration of an HJFET of this embodiment. This embodiment is obtained by replacing the p-type $Al_xGa_{1-x}N$ layer 531 and the undoped $Al_xGa_{1-x}N$ layer 532 in the fifth embodiment shown in FIG. 9, respectively with the AlGaN layer structures shown below:

a p-type composition graded $Al_xGa_{1-x}N$ layer 631 ($0.175 \leq x \leq 0.2$): 20 nm; and an undoped $Al_xGa_{1-x}N$ layer 632 (x=0.175): 20 nm.

AlGaN and GaN herein have different lattice constants, wherein a total thickness of 40 nm of the p-type composition graded $Al_xGa_{1-x}N$ layer 631 and the undoped $Al_xGa_{1-x}N$ layer 632 is not larger than the critical thickness where dislocation may occur.

Mg, Zn or the like may typically be used herein as the p-type impurity in the p-type composition graded $Al_xGa_{1-x}N$ layer 631. The Al compositional ratio of the p-type composition graded $Al_xGa_{1-x}N$ layer 631 continuously decreases (x=0.2→0.175) from the interface ($x_1$=0.2) with the channel layer 52 to the interface ($x_2$=0.175) with the undoped $Al_xGa_{1-x}N$ layer 632.

Because the recessed portion is formed by etching off a part of the undoped $Al_xGa_{1-x}N$ layer 632, the Al compositional ratio $x_a$ at the interface 63A with the gate electrode 57 is equivalent to $x_2$=0.175.

Concentration $N_A$ and activation ratio η of p-type impurity in the AlGaN layer 631 are combined so as to satisfy the above relational expression (13'). The thickness t of the p-type AlGaN layer in the above relational expression (13') means the thickness of the p-type layer which resides in the portion fallen between the gate interface 63A and the channel layer 52, and is typically adjusted to t=20 nm in this embodiment.

In thus-configured HJFET, an effect of suppressing gate leakage current based on the principle described above may be obtained, and $I_{max}$ and $V_{th}$ may fall in still more desirable ranges. Given, for example, $N_A$=$5 \times 10^{17}$ cm$^{-3}$ and η=0.6 (the effective impurity concentration is $3 \times 10^{17}$ cm$^{-3}$), the gate leakage current may be suppressed to as low as approximately 4% of that in the prior art (undoped uniform composition $Al_{0.2}Ga_{0.8}N$). A range of reduction in $I_{max}$ is approximately 18% as compared with the prior art.

The composition graded AlGaN is used as the p-type carrier supply layer in this embodiment, so that an effect of suppressing gate current may be obtained at an impurity concentration lower than that in the fifth embodiment using the compositionally uniform AlGaN. Because lower impurity concentration tends to improve the activation ratio, controllability of the epitaxial growth may be improved, and thereby yield ratio and reproducibility of the element characteristics may be improved.

The p-type carrier supply layer, configured in this embodiment using the p-type composition graded AlGaN layer 631, may of course be configured using two or three or more AlGaN layers varied in the composition in a step-wise manner.

(Seventh Embodiment)

Figure 11:
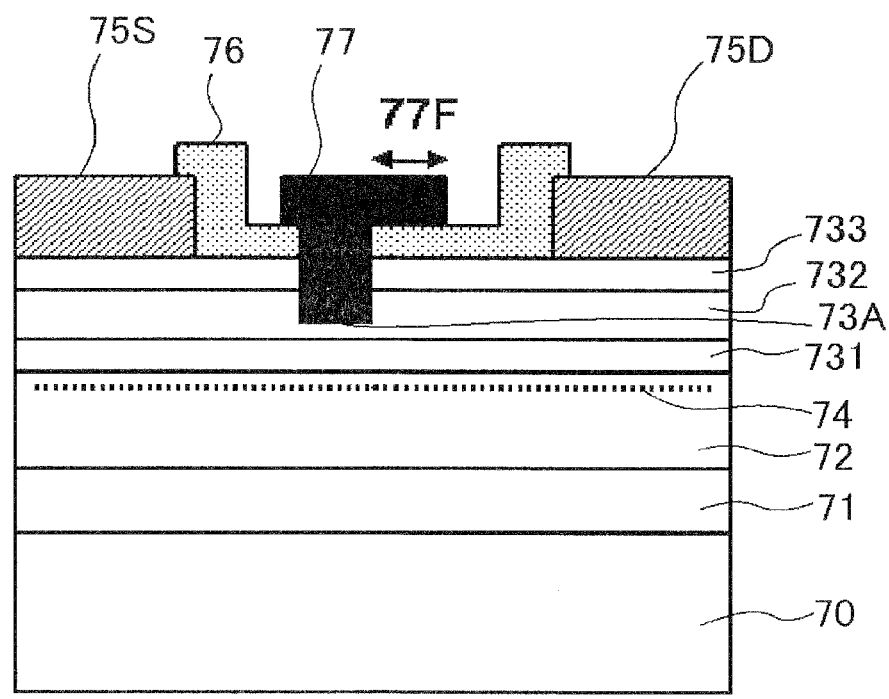
[FIG. 11] is a sectional view showing a sectional structure of the HJFET in an embodiment.

FIG. 11 is a sectional view showing a configuration of an HJFET of this embodiment.

In FIG. 11, an AlN buffer layer 71 composed of undoped, a channel layer 72 composed of undoped GaN, a p-type $Al_xGa_{1-x}N$ layer 731, an undoped $Al_xGa_{1-x}N$ layer 732 and an n-type $Al_xGa_{1-x}N$ layer 733 are stacked in this order on a substrate 70 composed of SiC. A two-dimensional electron gas 74 is formed in a GaN layer which functions as the channel layer 72 in the vicinity of the interface thereof with the p-type $Al_xGa_{1-x}N$ layer 731, based on piezoelectric polarization ascribable to difference in the lattice constant between GaN and AlGaN, and based on spontaneous polarization.

On the n-type $Al_xGa_{1-x}N$ layer 733, a source electrode 75S and a drain electrode 75D are formed, while establishing ohmic contact therewith. On the n-type $Al_xGa_{1-x}N$ layer 733, an insulating surface passivation film 76 composed of a SiN film is formed. A gate electrode 77 is formed in the recessed portion formed by etching off the SiN film and the n-type $Al_xGa_{1-x}N$ layer 733, and a portion of the undoped $Al_xGa_{1-x}N$ layer 732, while establishing Schottky contact with the $Al_xGa_{1-x}N$ layer 732 at an interface 73A. The gate electrode 77 herein has an overhang portion 77F projected out towards the drain electrode 75D side, thereby the gate electrode 77 is brought into contact with the surface passivation film 76 in the overhang portion thereof.

Thus-configured HJFET may be manufactured as follows.

First, over the (0001) SiC substrate 70, the layers below are sequentially grown typically by MOCVD:

the buffer layer 71 composed of undoped AlN: 20 nm;
the channel layer 72 composed of undoped GaN: 2 μm;
the p-type $Al_xGa_{1-x}N$ layer 731 (x=0.2): 20 nm;
the undoped $Al_xGa_{1-x}N$ layer 732 (x=0.2): 10 nm; and
the n-type $Al_xGa_{1-x}N$ layer 733 (x=0.2): 10 nm.

AlGaN and GaN herein have different lattice constants, wherein a total thickness of 40 nm of the AlGaN layers (p-type $Al_xGa_{1-x}N$ layer 731, undoped $Al_xGa_{1-x}N$ layer 732 and n-type $Al_xGa_{1-x}N$ layer 733) is not larger than the critical thickness where dislocation may occur.

Mg, Zn or the like may typically be used herein as the p-type impurity in the p-type $Al_xGa_{1-x}N$ layer 731, and silicon (Si) may typically be used as the n-type impurity in the $Al_xGa_{1-x}N$ layer 733.

Metals such as Ti/Al/Nb/Au or the like are deposited by vacuum evaporation on the n-type $Al_xGa_{1-x}N$ layer 733, and alloyed to thereby form the source electrode 75S and the drain electrode 75D respectively, while establishing ohmic contact.

Next, for example, a SiN film which functions as the surface passivation film 76 is grown approximately to as thick as 100 nm by PECVD. An opening is formed by etching the SiN film in the portion thereof fallen between the source electrode 75S and the drain electrode 75D. Next, a recessed portion is formed by etching off the n-type $Al_xGa_{1-x}N$ layer 733 and a part of the undoped $Al_xGa_{1-x}N$ layer 732, using the SiN film as a mask, typically using a dry etching apparatus using a $Cl_2$-base gas. Over the recessed portion, metals such as Ni/Au are deposited by vapor evaporation, followed by lift-off process, to thereby form the gate electrode 77 having the overhang portion 77F. In this way, Schottky contact of the gate electrode 77 with the undoped $Al_xGa_{1-x}N$ layer 732 is established at the interface 73A. By these procedures, the HJFET shown in FIG. 11 may be manufactured.

Concentration $N_A$ and activation ratio η of p-type impurity in the p-type $Al_xGa_{1-x}N$ layer 731 are combined so as to satisfy the above relational expression (8'). The thickness t of the p-type AlGaN layer in the above relational expression (8') means the thickness of the p-type layer which resides in the portion fallen between the gate interface 73A and the channel layer 72, and is typically adjusted to t=20 nm in this embodiment.

In thus-configured HJFET, an effect of suppressing gate leakage current based on the principle described above may be obtained, and $I_{max}$ and $V_{th}$ may fall in still more desirable ranges. Assuming, for example, the p-type impurity concentration $N_A$ as $1\times10^{18}$ cm$^{-3}$ and the activation ratio η as 0.5 (the effective impurity concentration is $5\times10^{17}$ cm$^{-3}$), the gate leakage current may be suppressed to as low as approximately 12% of that in the prior art (undoped $Al_{0.2}Ga_{0.8}N$). A range of reduction in $I_{max}$ is approximately 9% as compared with the prior art.

In this embodiment, positive charge of ionized impurity generates in the n-type AlGaN layer 733. As a consequence, the negative polarized charge in the $Al_xGa_{1-x}N$ layer 731 under the ohmic electrodes (the source electrode 75S and the drain electrode 75D) may be canceled to reduce the depletion layer, the potential barrier against electrons may be lowered, and thereby ohmic contact resistance may be reduced.

(Eighth Embodiment)

Figure 12:
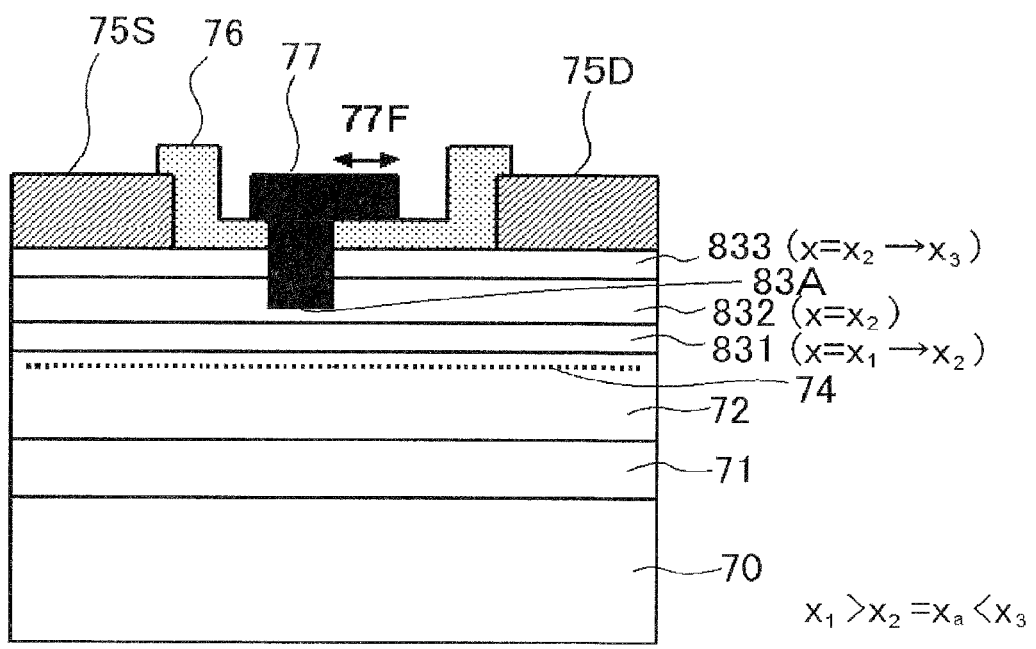
[FIG. 12] is a sectional view showing a sectional structure of the HJFET in an embodiment.

FIG. 12 is a sectional view showing a configuration of an HJFET of this embodiment. This embodiment obtained by replacing the AlGaN layers (p-type $Al_xGa_{1-x}N$ layer 731, undoped $Al_xGa_{1-x}N$ layer 732 and n-type $Al_xGa_{1-x}N$ layer 733) in the seventh embodiment shown in FIG. 11, respectively with the AlGaN layer structures shown below:

a p-type composition graded $Al_xGa_{1-x}N$ layer 831 (0.175≦x≦0.2): 20 nm;

an undoped $Al_xGa_{1-x}N$ layer 832 (x=0.175): 10 nm; and an n-type composition graded $Al_xGa_{1-x}N$ layer 833 (0.175≦x≦0.2): 10 nm.

AlGaN and GaN herein have different lattice constants, wherein a total thickness of 40 nm of the AlGaN layers (p-type composition graded $Al_xGa_{1-x}N$ layer 831, undoped $Al_xGa_{1-x}N$ layer 832, n-type composition graded $Al_xGa_{1-x}N$ layer 833) is not larger than the critical thickness where dislocation may occur.

Mg, Zn or the like may typically be used herein as the p-type impurity in the p-type composition graded $Al_xGa_{1-x}N$ layer 831, and silicon (Si) may typically be used as the n-type impurity in the n-type composition graded $Al_xGa_{1-x}N$ layer 833.

The Al compositional ratio of the p-type composition graded $Al_xGa_{1-x}N$ layer 831 continuously decreases (x=0.2→0.175) from the interface ($x_1$=0.2) with the channel layer 72 to the interface ($x_2$=0.175) with the undoped $Al_xGa_{1-x}N$ layer 832. The Al compositional ratio of the n-type composition graded $Al_xGa_{1-x}N$ layer 833 continuously decreases (x=0.175→0.2) from the interface ($x_2$=0.175) with the undoped $Al_xGa_{1-x}N$ layer 832 to the surface ($x_3$=0.2).

Because the recessed portion is formed by etching off the n-type composition graded $Al_xGa_{1-x}N$ layer 833 and a part of the undoped $Al_xGa_{1-x}N$ layer 832, the Al compositional ratio $x_a$ at the interface 83A with the gate electrode 77 is equivalent to $x_2$=0.175. Concentration $N_A$ and activation ratio r of a p-type impurity in the p-type composition graded $Al_xGa_{1-x}N$ layer 831 are combined so as to satisfy the above relational expression (13'). The thickness t of the p-type AlGaN layer in the above relational expression (13') means the thickness of the p-type layer which resides in the portion fallen between the gate interface 83A and the channel layer 72, and is typically adjusted to t=20 nm in this embodiment.

In thus-configured HJFET, an effect of suppressing gate leakage current based on the principle described above may be obtained, and $I_{max}$ and $V_{th}$ may fall in still more desirable ranges. Given, for example, $N_A$=$5\times10^{17}$ cm$^{-3}$ and n=0.6 (effective impurity concentration is $3\times10^{17}$ cm$^{-3}$), the gate leakage current may be suppressed to as low as approximately 4% of that in the prior art (undoped compositionally uniform $Al_{0.2}Ga_{0.8}N$). A range of reduction in $I_{max}$ is approximately 18% as compared with the prior art.

The composition graded $Al_xGa_{1-x}N$ layer 831 is used as the p-type carrier supply layer in this embodiment, so that an effect of suppressing gate leakage current may be obtained at an impurity concentration lower than that in the seventh embodiment using the compositionally uniform AlGaN. Because lower impurity concentration tends to improve the activation ratio, controllability of the epitaxial growth may be improved, and thereby yield ratio and reproducibility of the element characteristics may be improved.

The p-type carrier supply layer, configured in this embodiment using the p-type composition graded $Al_xGa_{1-x}N$ layer 831, may of course be configured using two or three or more AlGaN layers varied in the composition in a step-wise manner.

(Ninth Embodiment)

Figure 13:
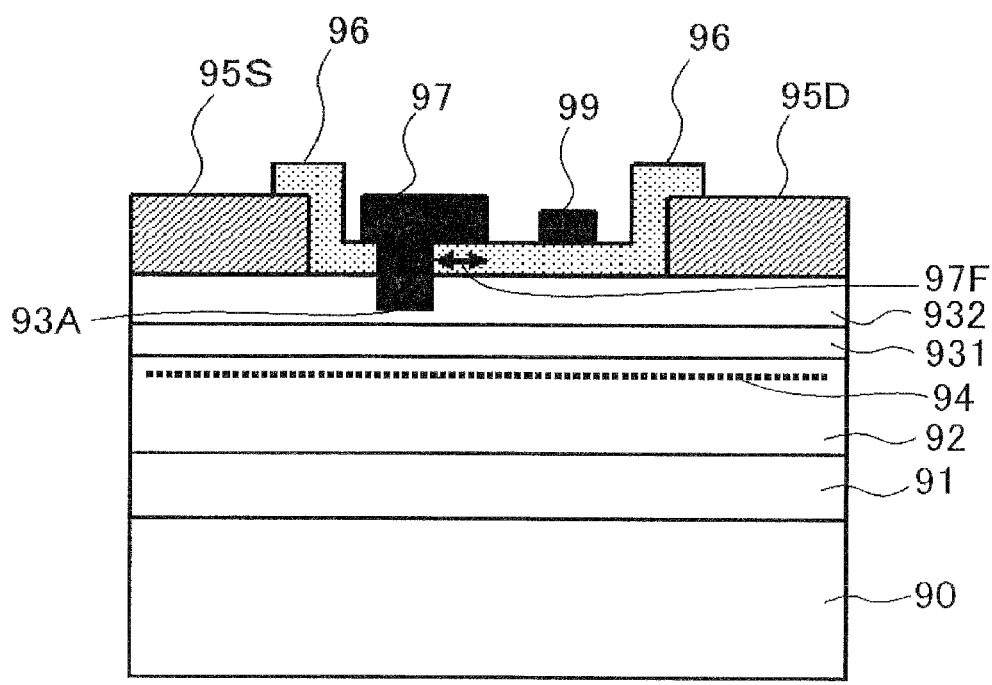
[FIG. 13] is a sectional view showing a sectional structure of the HJFET in an embodiment.

FIG. 13 is a sectional view showing a configuration of an HJFET of this embodiment.

In FIG. 13, a buffer layer 91 composed of undoped AlN, a channel layer 92 composed of undoped GaN, a p-type $Al_xGa_{1-x}N$ layer 931 and an undoped $Al_xGa_{1-x}N$ layer 932 are stacked in this order on a substrate 90 composed of SiC. A two-dimensional electron gas 94 is formed in the channel layer 92 in the vicinity of the interface thereof with the p-type $Al_xGa_{1-x}N$ layer 931, based on piezoelectric polarization ascribable to difference in the lattice constant between GaN and AlGaN, and based on spontaneous polarization.

Over the undoped $Al_xGa_{1-x}N$ layer 932, a source electrode 95S and a drain electrode 95D are formed, while individually establishing ohmic contact therewith. A surface passivation film 96 composed of SiN is formed over the undoped $Al_xGa_{1-x}N$ layer 932. A gate electrode 97 is formed in a recessed portion formed by etching off the surface passivation film 96 and a part of the undoped $Al_xGa_{1-x}N$ layer 932, while establishing Schottky contact at the interface 93A with the undoped $Al_xGa_{1-x}N$ layer 932.

The gate electrode 97 herein has an overhang portion 97F projected out towards the drain electrode 95D side, thereby the gate electrode 97 is brought into contact with the surface passivation film 96 in the overhang portion thereof. In this embodiment, a Schottky electrode 99 is formed on the surface passivation film 96 in the portion thereof fallen between the gate electrode 97 and the drain electrode 95D.

Thus-configured HJFET may be manufactured as follows.

First, over the (0001) SiC substrate 90, the layers below are grown typically by MOCVD, in the order and to thickness described below:

the buffer layer 91 composed of undoped AlN: 20 nm;
the channel layer 92 composed of undoped GaN: 2 μm;
the p-type $Al_xGa_{1-x}N$ layer 931 (x=0.2): 20 nm; and
the undoped $Al_xGa_{1-x}N$ layer 932 (x=0.2): 20 nm.

AlGaN and GaN herein have different lattice constants, wherein a total thickness of 40 nm of the AlGaN layers (p-type $Al_xGa_{1-x}N$ layer 931 and undoped $Al_xGa_{1-x}N$ layer 932) is not larger than the critical thickness where dislocation may occur.

Mg, Zn or the like may typically be used herein as the p-type impurity in the p-type $Al_xGa_{1-x}N$ layer 931. Metals such as Ti/Al/Nb/Au or the like are deposited by vacuum evaporation on the undoped $Al_xGa_{1-x}N$ layer 932, and alloyed to thereby form the source electrode 95S and the drain electrode 95D respectively, while establishing ohmic contact.

Next, for example, a SiN film which functions as the surface passivation film 96 is grown approximately to as thick as 100 nm by PECVD. An opening is formed by etching the SiN film in the portion thereof fallen between the source electrode 95S and the drain electrode 95D. Next, a recessed portion is formed by etching off a part of the undoped $Al_xGa_{1-x}N$ layer 932, using the SiN film as a mask, typically using a dry etching apparatus using a $Cl_2$-base gas.

Over the recessed portion, metals such as Ni/Au are deposited by vapor evaporation, followed by lift-off process, to thereby form the gate electrode 97 having the overhang portion 97F. In this way, Schottky contact with the AlGaN layer is established at the interface 93A. The Schottky electrode 99 is formed on the surface passivation film 96 in the portion thereof fallen between the gate electrode 97 and the drain electrode 95D, typically by depositing metals such as Ti/platinum (Pt)/Au by vapor evaporation, followed by the lift-off process. By these procedures, the HJFET shown in FIG. 13 may be manufactured.

Concentration $N_A$ and activation ratio η of p-type impurity in the $Al_xGa_{1-x}N$ layer 931 are combined so as to satisfy the above relational expression (8'). The thickness t of the p-type AlGaN layer in the above relational expression (8') means the thickness of the p-type layer which resides in the portion fallen between the gate interface 93A and the channel layer 92, and is typically adjusted to t=20 nm in this embodiment.

In thus-configured HJFET, an effect of suppressing gate leakage current based on the principle described above may be obtained, and $I_{max}$ and $V_{th}$ may fall in still more desirable ranges. Assuming, for example, the p-type impurity concentration $N_A$ as $3\times10^{18}$ cm$^{-3}$ and the activation ratio η as 0.33 (the effective impurity concentration is $1\times10^{18}$ cm$^{-3}$), the gate leakage current may be suppressed to as low as approximately 1% of that in the prior art (undoped $Al_{0.2}Ga_{0.8}N$). A range of reduction in $I_{max}$ is approximately 18% as compared with the prior art.

In this embodiment, the Schottky electrode 99 functions also as so-called Faraday shield, as being connected to the source. More specifically, electrical coupling between the gate and the drain may be shielded, capacitance between the gate and the drain may be reduced, and thereby the gain and isolation characteristics may be improved. The Schottky electrode 99 may be connected to the gate. In this case, the Schottky electrode 99 may function as so-called field plate, and breakdown voltage of the gate may further be improved.

(Tenth Embodiment)

Figure 14:
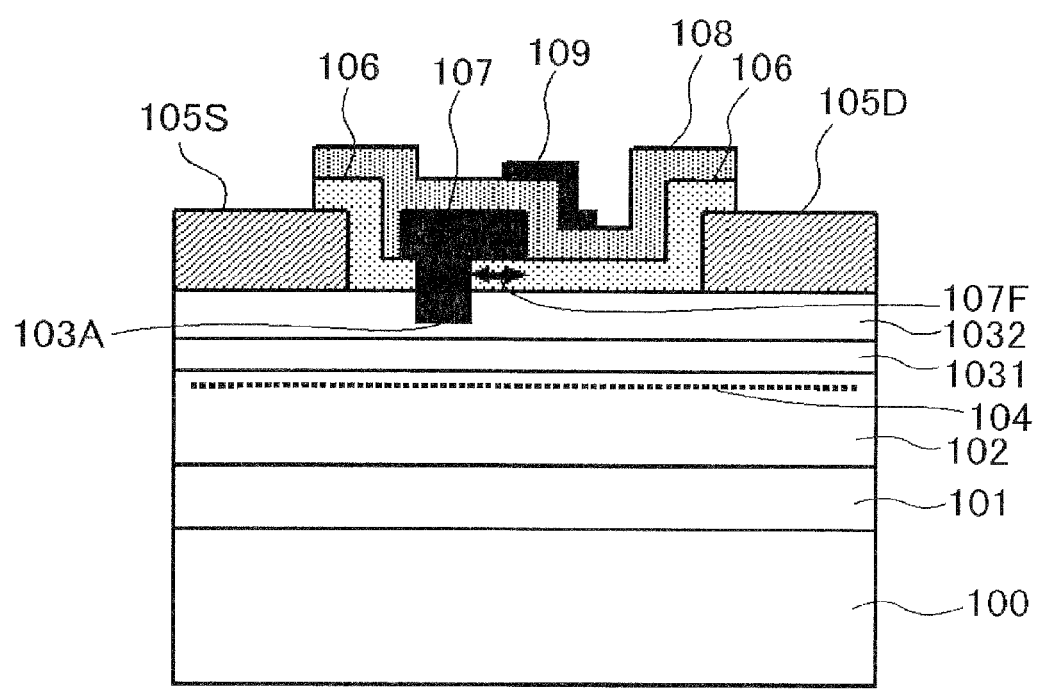
[FIG. 14] is a sectional view showing a sectional structure of the HJFET in an embodiment.

FIG. 14 is a sectional view showing a configuration of an HJFET of this embodiment.

In FIG. 14, a buffer layer 101 composed of undoped AlN, a channel layer 102 composed of undoped GaN, a p-type $Al_xGa_{1-x}N$ layer 1031 and an undoped $Al_xGa_{1-x}N$ layer 1032 are sequentially stacked on a substrate 100 composed of SiC. A two-dimensional electron gas 104 is formed in the channel layer 102 in the vicinity of the interface thereof with the p-type $Al_xGa_{1-x}N$ layer 1031, based on piezoelectric polarization ascribable to difference in the lattice constant between GaN and AlGaN, and based on spontaneous polarization.

Over the undoped $Al_xGa_{1-x}N$ layer 1032, a source electrode 105S and a drain electrode 105D are formed, while individually establishing ohmic contact therewith. A SiN film which functions as a first surface passivation film 106 is formed over the undoped $Al_xGa_{1-x}N$ layer 1032. A gate electrode 107 is formed in a recessed portion formed by etching off the first surface passivation film 106 and a part of the undoped $Al_xGa_{1-x}N$ layer 1032, while establishing Schottky contact at the interface 103A with the undoped $Al_xGa_{1-x}N$ layer 1032.

The gate electrode 107 herein has an overhang portion 107F projected out towards the drain electrode 105D side, thereby the gate electrode 107 is brought into contact with the first surface passivation film 106 in the overhang portion thereof. In this embodiment, a second surface passivation film 108 is further provided in the region fallen between the source electrode 105S and the drain electrode 105D, so as to cover the top surfaces of the first surface passivation film 106 and the gate electrode 107. The second surface passivation film is composed of a SiN film, and a Schottky electrode 109 is formed on the second surface passivation film 108 in the portion thereof fallen between the gate electrode 107 and the drain electrode 105D.

Thus-configured HJFET may be manufactured as follows. First, over the substrate 100 composed of (0001) SiC, the layers below are sequentially grown typically by MOCVD:

the buffer layer 101 composed of undoped AlN: 20 nm;
the channel layer 102 composed of undoped GaN: 2 μm;
the p-type $Al_xGa_{1-x}N$ layer 1031 (x=0.2): 20 nm; and
the undoped $Al_xGa_{1-x}N$ layer 1032 (x=0.2): 20 nm.

AlGaN and GaN herein have different lattice constants, wherein a total thickness of 40 nm of the AlGaN layers (p-type $Al_xGa_{1-x}N$ layer 1031 and undoped $Al_xGa_{1-x}N$ layer 1032) is not larger than the critical thickness where dislocation may occur.

Mg, Zn or the like may typically be used herein as the p-type impurity in the p-type $Al_xGa_{1-x}N$ layer 1031. Metals such as Ti/Al/Nb/Au or the like are deposited by vacuum evaporation on the undoped $Al_xGa_{1-x}N$ layer 1032, and alloyed to thereby form the source electrode 105S and the drain electrode 105D respectively, while establishing ohmic contact.

Next, for example, a SiN film which functions as the first surface passivation film 106 is grown approximately to as thick as 100 nm by PECVD. An opening is formed by etching the SiN film in the portion thereof fallen between the source electrode 105S and the drain electrode 105D. Next, a recessed portion is formed by etching off a part of the undoped $Al_xGa_{1-x}N$ layer 1032, using the first surface passivation film 106 as a mask, typically using a dry etching apparatus using a $Cl_2$-base gas. Over the recessed portion, metals such as Ni/Au are deposited by vapor evaporation, followed by lift-off process, to thereby form the gate electrode 107 having the overhang portion 107F. In this way, Schottky contact with the undoped $Al_xGa_{1-x}N$ layer 1032 is established at the interface 103A.

Next, for example, the SiN film 108 which functions as the second surface passivation film is grown by PECVD typically to as thick as 200 nm or around. Metals such as Ti/Pt/Au are deposited by vapor evaporation on the second surface passivation film 108 in the portion thereof fallen between the gate electrode 107 and the drain electrode 105D, followed by lift-off process, to thereby form the Schottky electrode 109. By these procedures, the HJFET shown in FIG. 14 may be manufactured.

Concentration $N_A$ and activation ratio η of p-type impurity in the AlGaN layer 1031 are combined so as to satisfy the above relational expression (8'). The thickness t of the p-type AlGaN layer in the above relational expression (8') means the thickness of the p-type layer which resides in the portion fallen between the gate interface 103A and the channel layer 102, and is typically adjusted to t=20 nm in this embodiment.

In thus-configured HJFET, an effect of suppressing gate leakage current based on the principle described above may be obtained, and $I_{max}$ and $V_{th}$ may fall in still more desirable ranges. Assuming, for example, the p-type impurity concentration $N_A$ as $3\times10^{18}$ cm$^{-3}$ and the activation ratio η as 0.33 (the effective impurity concentration is $1\times10^{18}$ cm$^{-3}$), the gate leakage current may be suppressed to as low as approximately 1% of that in the prior art (undoped $Al_{0.2}Ga_{0.8}N$). A range of reduction in $I_{max}$ is approximately 18% as compared with the prior art.

The configuration of this embodiment is such as having the second surface passivation film 108 is formed between the gate electrode 107 and the Schottky electrode 109. Then, the Schottky electrode 109 can surround at least a part of the gate electrode 107, while the second surface passivation film 108 is disposed between the Schottky electrode 109 and the gate electrode 107. Accordingly, if the Schottky electrode 109 is connected to the source, the effect of shielding between the gate and the drain may considerably be improved, and thereby the gain and isolation characteristics can further be improved.

The present invention, having been described above referring to the embodiments, is not limited to the above-described embodiments, and of course allows various embodiments conforming to the principle of the present invention.

For example, AlGaN used as a material for composing the carrier supply layer in the above-described embodiments may be replaced by other Group III nitride semiconductors. For example, InAlN, InGaN, InAlGaN, AlN or GaN may be used. Alternatively, super lattice layers composed of at least two different semiconductors selected from GaN, AlGaN, InAlN, InGaN, InAlGaN, AlN and InN may be adoptable.

Although, in the above-described embodiments, the carrier supply layer composed of p-type AlGaN was formed as being brought into contact with the GaN channel layer, an undoped AlGaN spacer layer may be interposed between the GaN layer and the p-type AlGaN layer. Alternatively, an n-type impurity, such as Si, may be doped into a part of the AlGaN carrier supply layer.

The channel material, for which GaN was used in the above-described embodiments, may be any other Group III nitride semiconductor having a band gap smaller than that of the carrier supply layer. For example, InN, InGaN, AlGaN, InAlN or InAlGaN may be adoptable. The channel layer, having been described as being an undoped one, may contain an n-type impurity such as Si doped into a part, or entire portion thereof.

Although, in the above-described embodiments, SiN was used as a material composing the insulating passivation film, a material for composing the insulating passivation film may be any other dielectric. For example, $SiO_2$ or SiON may be used.

Although, in the above-described embodiments, SiC was used as a substrate material, any other substrate may be adoptable. For example, sapphire, Si or GaN may be adoptable.

The invention claimed is:

1. A field effect transistor comprising:
a channel layer composed of $In_yGa_{1-y}N$ ($0 \leq y \leq 1$) in which two-dimensional electron gas is to be formed;
a carrier supply layer composed of $Al_xGa_{1-x}N$ ($0 \leq x \leq 1$), said carrier supply layer being provided over said channel layer and including at least one p-type layer; and
a source electrode, a drain electrode and a gate electrode which are disposed facing said channel layer through said p-type layer, and provided over said carrier supply layer, wherein:
the following expression is satisfied:

$$x_a < x_1,$$

where $x_a$ denotes an Al compositional ratio of said carrier supply layer at an interface with the gate electrode, and $x_1$ denotes an Al compositional ratio at an interface with said channel layer; and
the following expression is satisfied:
[Mathematical Formula 3]

$$5.6\times10^{11}x_1 < N_A \times \eta \times t \ [\text{cm}^{-2}] + 5.6\times10^{13}(x_1-x_a) < 5.6\times10^{13}x_1,$$

where $x_a$ denotes the Al compositional ratio, t denotes a thickness of said p-type layer, $N_A$ denotes an impurity concentration, and η denotes an activation ratio.

2. The field effect transistor as claimed in claim 1, wherein said field effect transistor has a negative threshold voltage.

3. The field effect transistor as claimed in claim 1, satisfying the following relational expression:
[Mathematical Formula 4]

$$5.6\times10^{11}x_1 < N_A \times \eta \times t \ [\text{cm}^{-2}] + 5.6\times10^{13}(x_1-x_a) < 2.8\times10^{13}x_1.$$

4. The field effect transistor as claimed in claim 3, wherein said gate electrode is provided on a same plane together with said source electrode and said drain electrode.

5. The field effect transistor as claimed in claim 1, wherein said gate electrode is provided on a same plane together with said source electrode and said drain electrode.

6. The field effect transistor as claimed in claim 3, wherein said field effect transistor has a negative threshold voltage.

7. A field effect transistor comprising:
a channel layer composed of $In_yGa_{1-y}N$ ($0 \leq y \leq 1$);
a carrier supply layer composed of $Al_xGa_{1-x}N$ ($0 \leq x \leq 1$), said carrier supply layer being provided over said channel layer and including at least one p-type layer; and
a source electrode, a drain electrode and a gate electrode which are disposed facing said channel layer through said p-type layer, and provided over said carrier supply layer, said gate electrode being formed to be in contact with a recess portion formed by removing a part of said carrier supply layer,
wherein the following relational expression is satisfied:

$$5.6\times10^{11}x_1 < N_A \times \eta \times t \ [\text{cm}^{-2}] + 5.6\times10^{13}(x_1-x_a) < 5.6\times10^{13}x_1,$$

where $x_a$ denotes an Al compositional ratio of said carrier supply layer at an interface with said gate electrode and is smaller than $x_1$, $x_1$ denotes an Al compositional ratio at an interface with said channel layer, t denotes a thickness of said p-type layer between said recessed portion and said channel layer, $N_A$ denotes an impurity concentration, and η denotes an activation ratio.

8. The field effect transistor as claimed in claim 7, wherein said field effect transistor has a negative threshold voltage.

* * * * *